(12) United States Patent
Park et al.

(10) Patent No.: US 11,557,596 B2
(45) Date of Patent: Jan. 17, 2023

(54) SEMICONDUCTOR MEMORY DEVICE

(71) Applicant: Samsung Electronics Co., Ltd., Suwon-si (KR)

(72) Inventors: Seoryong Park, Ansan-si (KR); Seunguk Han, Suwon-si (KR); Jiyoung Ahn, Suwon-si (KR); Kiseok Lee, Seoul (KR); Yoonyoung Choi, Seoul (KR); Jiseok Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 152 days.

(21) Appl. No.: 17/192,086

(22) Filed: Mar. 4, 2021

(65) Prior Publication Data
US 2022/0020758 A1 Jan. 20, 2022

(30) Foreign Application Priority Data
Jul. 17, 2020 (KR) .................. 10-2020-0089026

(51) Int. Cl.
*H01L 27/11551* (2017.01)
*H01L 27/11519* (2017.01)
(Continued)

(52) U.S. Cl.
CPC .......... *H01L 27/11551* (2013.01); *G11C 7/18* (2013.01); *G11C 8/14* (2013.01);
(Continued)

(58) Field of Classification Search
CPC ......... H01L 27/11551; H01L 27/11519; H01L 27/11565; H01L 27/11578;
(Continued)

(56) References Cited

U.S. PATENT DOCUMENTS
9,012,321 B1   4/2015  Kim et al.
9,029,957 B2   5/2015  Yoon
(Continued)

FOREIGN PATENT DOCUMENTS
KR   1020170103204 A   9/2017
TW      202016933 A   5/2020

OTHER PUBLICATIONS

Examination report dated Nov. 10, 2021 by the Taiwanese Patent Office for the corresponding Taiwanese Patent Application.

*Primary Examiner* — Allison Bernstein
(74) *Attorney, Agent, or Firm* — Muir Patent Law, PLLC

(57) ABSTRACT

A semiconductor memory device includes a substrate with a cell array region, a first interface region, and a second interface region, the cell array region being provided with active regions, bit lines on the cell array region and the second interface region, dielectric patterns on top surfaces of the bit lines and extending along the top surfaces of the bit lines and further extending onto the first interface region, a device isolation pattern on the substrate, and including a first portion on the cell array region and a second portion on the first interface region, the first portion defining the active regions, the second portion being provided with first recesses, and each first recess being disposed between two adjacent dielectric patterns, and first sacrificial semiconductor patterns disposed on the first interface region and in the first recesses. The first sacrificial semiconductor patterns include polycrystalline silicon.

20 Claims, 30 Drawing Sheets

(51) Int. Cl.
  *G11C 8/14* (2006.01)
  *H01L 27/11578* (2017.01)
  *G11C 7/18* (2006.01)
  *H01L 27/11565* (2017.01)

(52) U.S. Cl.
  CPC .. *H01L 27/11519* (2013.01); *H01L 27/11565* (2013.01); *H01L 27/11578* (2013.01)

(58) Field of Classification Search
  CPC ......... H01L 27/10814; H01L 27/10823; H01L 27/10855; H01L 27/10885; H01L 27/10894; H01L 27/10805; H01L 27/10844; H01L 27/10882; H01L 27/10888; H01L 27/10873; G11C 7/18; G11C 8/14
  See application file for complete search history.

(56) References Cited

U.S. PATENT DOCUMENTS

| | | |
|---|---|---|
| 9,379,004 B1 | 6/2016 | Kwon et al. |
| 9,412,642 B2 | 8/2016 | Chung |
| 9,929,162 B1 | 3/2018 | Feng et al. |
| 10,727,274 B2 | 7/2020 | Chen et al. |
| 11,404,538 B2 * | 8/2022 | Park .................. H01L 21/76224 |
| 2019/0189692 A1 | 6/2019 | Jeong et al. |
| 2019/0296026 A1 | 9/2019 | Ji et al. |
| 2019/0348418 A1 | 11/2019 | Hwang et al. |

* cited by examiner

SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2020-0089026 filed on Jul. 17, 2020 in the Korean Intellectual Property Office, the disclosure of which is hereby incorporated by reference in its entirety.

BACKGROUND

The present inventive concepts relate to a semiconductor memory device, and more particularly, to a semiconductor memory device including a sacrificial semiconductor pattern.

Semiconductor devices are beneficial in the electronic industry because of their small size, multi-functionality, and/or low fabrication costs. Semiconductor devices have been increasingly integrated with the development of electronic industry. Line widths of patterns of semiconductor devices are being reduced for high integration thereof. However, new exposure techniques and/or expensive exposure techniques are demanded for forming finer patterns such that it is difficult to highly integrate semiconductor devices. Various studies have thus recently been conducted for new integration techniques.

SUMMARY

Some example embodiments of the present inventive concepts provide a semiconductor memory device with increased reliability.

The present inventive concepts will be clearly understood to those skilled in the art from the following description.

According to an embodiment of the present inventive concept, a semiconductor memory device includes a substrate that has a cell array region, a first interface region, and a second interface region between the cell array region and the first interface region, the cell array region being provided with a plurality of active regions that extend in a first direction, a plurality of bit lines on the cell array region and the second interface region, the plurality of bit lines extending in a second direction that intersects the first direction, a plurality of dielectric patterns on top surfaces of the plurality of bit lines, the plurality of dielectric patterns extending in the second direction along the top surfaces of the plurality of bit lines and further extending onto the first interface region, a device isolation pattern on the substrate, the device isolation pattern including a first portion on the cell array region and a second portion on the first interface region, the first portion of the device isolation pattern defining the plurality of active regions, the second portion of the device isolation pattern being provided with a plurality of first recesses, and each of the plurality of first recesses being, when the semiconductor device is viewed in a plan view, disposed between two adjacent dielectric patterns among the plurality of dielectric patterns which are disposed on the first interface region, and a plurality of first sacrificial semiconductor patterns disposed on the first interface region and in the plurality of first recesses of the device isolation pattern. The plurality of first sacrificial semiconductor patterns include polycrystalline silicon.

According to an embodiment of the present inventive concept, a semiconductor memory device includes a substrate that has a cell array region, a first interface region, and a second interface region between the cell array region and the first interface region, the cell array region being provided with a plurality of active regions that extend in a first direction, a plurality of bit lines on the cell array region and the second interface region, the plurality of bit lines extending in a second direction that intersects the first direction, a plurality of word lines on the substrate, the word lines extending in a third direction perpendicular to the second direction, the first direction, the second direction, and the third direction being on the same plane, a plurality of insulation fences on the plurality of word lines and spaced apart in the third direction from each other, the plurality of insulation fences and the plurality of bit lines being alternately and repeatedly disposed in the third direction, and a plurality of first sacrificial semiconductor patterns disposed on the first interface region, the plurality of first sacrificial semiconductor patterns and the plurality of insulation fences being alternately and repeatedly disposed in the second direction, and the plurality of first sacrificial semiconductor patterns including polycrystalline silicon.

According to an embodiment of the present inventive concept, a semiconductor memory device includes a substrate that has a cell array region, a first interface region, and a second interface region between the cell array region and the first interface region, the cell array region being provided with a plurality of active regions that extend in a first direction, a plurality of bit lines on the cell array region and the second interface region, the plurality of bit lines extending in a second direction that intersects the first direction, a plurality of word lines disposed on the plurality of active regions, the plurality of word lines extending in a third direction perpendicular to the second direction, the first direction, the second direction, and the third direction being on the same plane, a plurality of dielectric patterns on top surfaces of the plurality of bit lines, the plurality of dielectric patterns extending along the top surfaces of the plurality of bit lines and further extending onto the first interface region, a plurality of spacer structures on opposite sidewalls of the plurality of dielectric patterns, each of the plurality of spacer structures including a first spacer, a second spacer, and an air gap between the first spacer and the second spacer, a device isolation pattern on the substrate, the device isolation pattern including a first portion on the cell array region and a second portion on the first interface region, the first portion of the device isolation pattern defining the plurality of active regions, and the second portion of the device isolation pattern being provided with a plurality of recesses, a plurality of first sacrificial semiconductor patterns in the plurality of recesses of the device isolation pattern on the first interface region, the plurality of first sacrificial semiconductor patterns including polycrystalline silicon, a diffusion break pattern that covers the plurality of dielectric patterns and the plurality of spacer structures, a plurality of landing pads on the diffusion break pattern, and a plurality of bottom electrodes on plurality of landing pads.

BRIEF DESCRIPTION OF THE DRAWINGS

FIGS. 2A to 10A illustrate plan views showing a method of fabricating a semiconductor memory device according to some example embodiments of the present inventive concepts.

FIGS. 2B to 10B illustrate cross-sectional views taken along lines I-I' and II-II' of FIGS. 2A to 10A.

FIGS. 2C to 10C illustrate cross-sectional views taken along lines III-III' and IV-IV' of FIGS. 2A to 10A.

DETAILED DESCRIPTION OF EMBODIMENTS

Figure 1A:
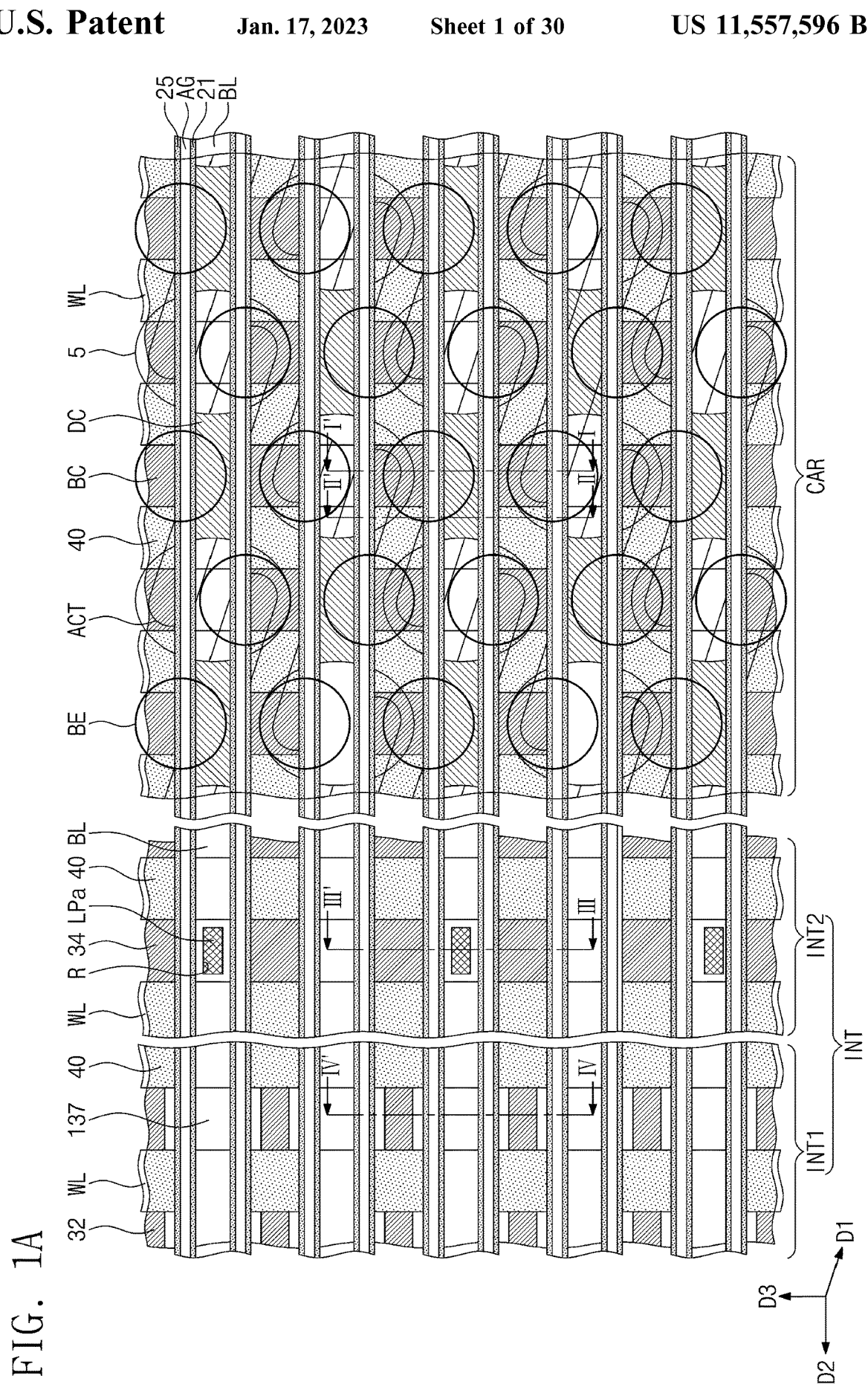
FIG. 1A illustrates a plan view showing a semiconductor memory device according to some example embodiments of the present inventive concepts.

In this description, like reference numerals may indicate like components. The following will now describe a semiconductor memory device according to some example embodiments of the present inventive concepts.

Figure 1B:
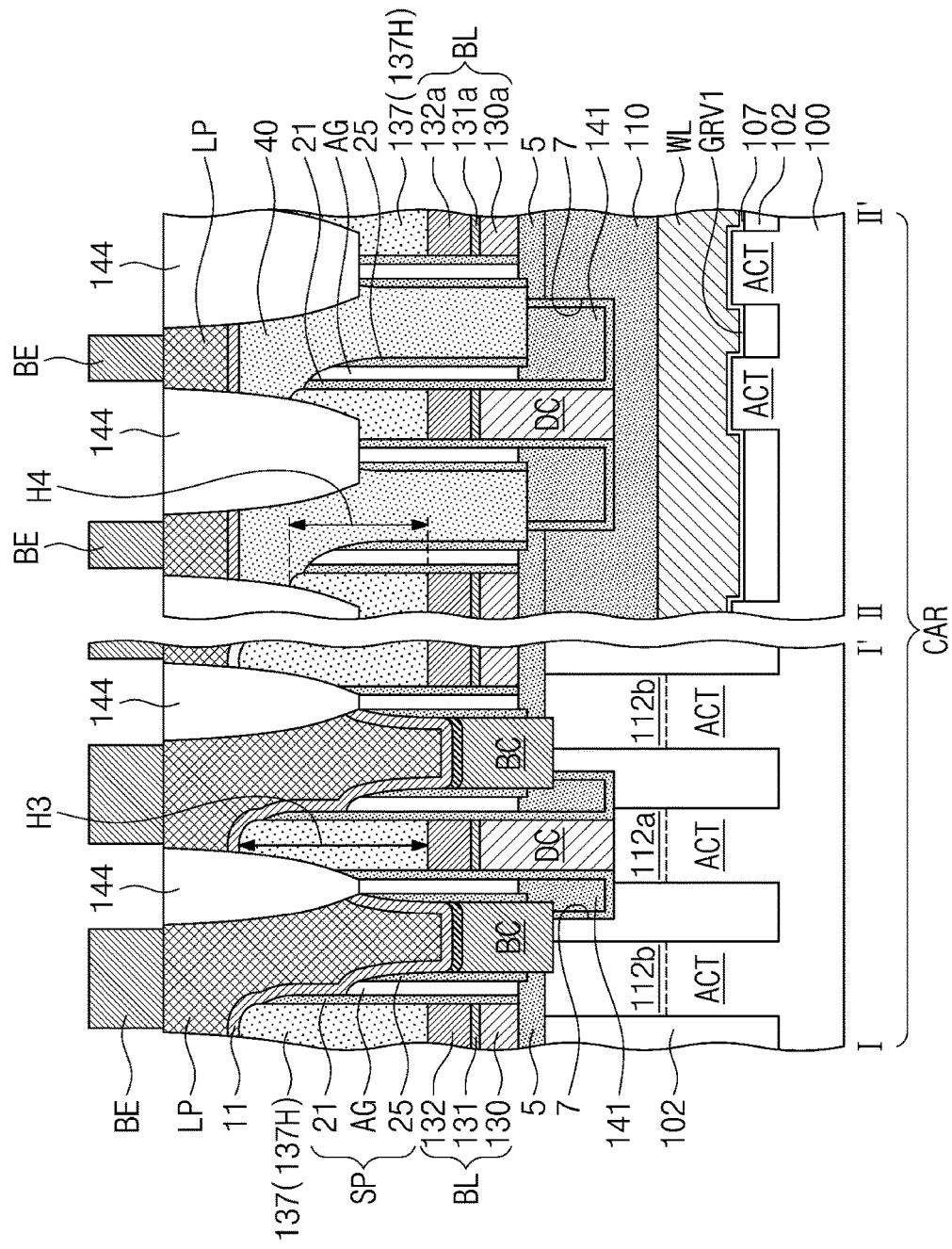
FIG. 1B illustrates a cross-sectional view taken along lines I-I' and II-II' of FIG. 1A.
Figure 1C:
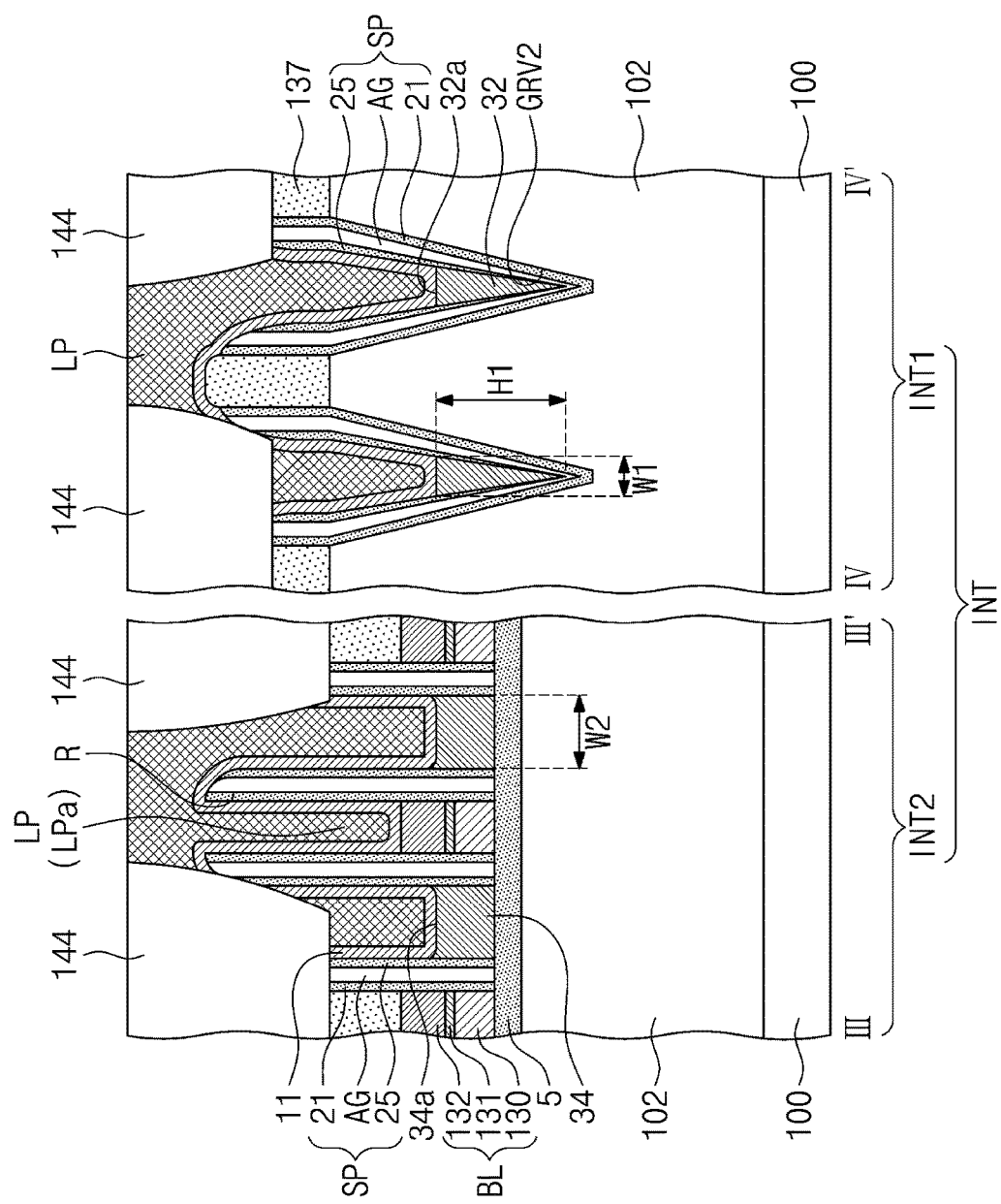
FIG. 1C illustrates a cross-sectional view taken along lines III-III' and IV-IV' of FIG. 1A.

FIG. 1A illustrates a plan view showing a semiconductor memory device according to some example embodiments of the present inventive concepts. FIG. 1B illustrates a cross-sectional view taken along lines I-I' and II-II' of FIG. 1A. FIG. 1C illustrates a cross-sectional view taken along lines III-III' and IV-IV' of FIG. 1A.

Referring to FIGS. 1A to 1C, a substrate 100 may be provided. The substrate 100 may have a cell array region CAR and an interface region INT adjacent to the cell array region CAR. The interface region INT may be interposed between the cell array region CAR and a peripheral circuit region (not shown). When the semiconductor device is viewed in a plan view (or in a top down view), the interface region INT may surround the cell array region CAR. The cell array region CAR may be provided with active sections ACT (i.e., active regions). The interface region INT is not provided with the active sections ACT. The interface region INT may include a first interface region INT1 and a second interface region INT2. The second interface region INT2 may be interposed between the first interface region INT1 and the cell array region CAR.

A device isolation pattern 102 may be provided on the cell array region CAR of the substrate 100. The device isolation pattern 102 may include or may be formed of a dielectric material. For example, the device isolation pattern 102 may include or may be formed of silicon oxide. On the cell array region CAR, the device isolation pattern 102 may define the active sections ACT of the substrate 100. When the semiconductor device is viewed in a plan view, the device isolation pattern 102 may isolate the active sections ACT from each other. When the semiconductor device is viewed in a plan view, each of the active sections ACT may have a bar shape that extends in a first direction D1. The active sections ACT may be portions of the substrate 100 that are surrounded by the device isolation pattern 102.

The device isolation pattern 102 may be disposed on the interface region INT. On the first interface region INT1, the device isolation pattern 102 may have a plurality of second recesses GRV2. The second recesses GRV2 may extend along a second direction D2 parallel to a dielectric pattern 137. The second recesses GRV2 may be disposed spaced apart from each other in a third direction D3. The second recesses GRV2 may be disposed spaced apart from each other across the dielectric pattern 137. The second recesses GRV2 and the dielectric patterns 137 may be disposed alternately in the third direction D3. The second recesses GRV2 may have their widths that decrease as approaching a top surface of the substrate 100. The device isolation pattern 102 may have a top surface that is higher on the first interface region INT1 than on the second interface region INT2. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The substrate 100 may include or may be formed of a semiconductor material. For example, the substrate 100 may be a silicon substrate, a germanium substrate, or a silicon-germanium substrate. The device isolation pattern 102 may include or may be formed of one or more of oxide (e.g., silicon oxide), nitride (e.g., silicon nitride), and oxynitride (e.g., silicon oxynitride). One of the active sections ACT may be arranged to adjoin centers of other neighboring ones of the active sections ACT.

Word lines WL may be disposed on the cell array region CAR and the interface region INT of the substrate 100. The word lines WL may extend in the third direction D3 that intersects the first direction D1. On the cell array region CAR, the word lines WL may extend across the active sections ACT. For example, a pair of word lines WL may be disposed on one active section ACT. The word lines WL may be disposed in first recesses GRV1 defined by the device isolation pattern 102 and the active sections ACT. In an embodiment, each of the first recesses GRV1 may be a trench, extending in the third direction D3. The word lines WL may include or may be formed of a conductive material. For example, the word lines WL may include or may be formed of polycrystalline silicon, impurity-doped polycrystalline silicon, metal, or metal silicide. A dielectric layer 107 may be disposed between an inner wall of the first recess GRV1 and each word line WL. The dielectric layer 107 may include or may be formed of one or more of thermal oxide, silicon nitride, silicon oxynitride, and high-k dielectric. The word lines WL may have uneven bottom surfaces (e.g., corrugated bottom surfaces). The formation of the uneven bottom surface of the word lines WL will be described later with reference to FIGS. 2A, 2B, and 2C.

A first impurity region 112a and a pair of second impurity regions 112b may be provided on the cell array region CAR. The first impurity region 112a may be disposed in each active section ACT between a pair of word lines WL. The pair of second impurity regions 112b may be disposed in opposite end portions of each active section ACT. For example, the first and second impurity regions 112a and 112b may be doped with N-type impurities. The first impurity region 112a may correspond to a common drain region, and the second impurity regions 112b may correspond to source regions. A transistor may be constituted by each word line WL and its adjacent first and second impurity regions 112a and 112b. As the word lines WL are disposed in the first recesses GRV1, channels below the word lines WL may have their increased lengths. Accordingly, short-channel effects may be reduced or minimized.

The word lines WL may have their top surfaces at a lower level than that of top surfaces of the active sections ACT. Word-line capping patterns 110 may be disposed on corresponding word lines WL. The word-line capping patterns 110 may have their linear shapes that extend along a lengthwise direction (e.g., the third direction D3) of the word lines WL. The word-line capping patterns 110 may cover entire top surfaces of the word lines WL. The word-line capping patterns 110 may have their top surfaces at the same level as that of the top surface of the substrate 100. In an embodiment, the word-line capping patterns 110 may have their top surfaces at the same level as that of the top surface of the first and second impurity regions 112a and 112b which are provided with the substrate 100. The word-line capping patterns 110 may include or may be formed of a dielectric material. For example, the word-line capping patterns 110 may include or may be formed of silicon oxide or silicon nitride.

An interlayer dielectric pattern 5 may be disposed on the substrate 100. The interlayer dielectric pattern 5 may be formed of a single or multiple layer including at least one selected from a silicon oxide layer, a silicon nitride layer, and a silicon oxynitride layer. When the semiconductor device is viewed in a plan view, the interlayer dielectric pattern 5 may be formed to have island shapes that are spaced apart from each other. The interlayer dielectric pattern 5 may cover end portions of two neighboring active sections ACT. The substrate 100, the device isolation pattern 102, and the word-line capping pattern 110 may be partially recessed to provide a third recess 7. The third recess 7 may have a net shape when the semiconductor device is viewed in a plan view.

A second contact DC may be disposed on the cell array region CAR. The second contact DC may be disposed in a portion of the active section ACT of the substrate 100 between a pair of word lines WL. The second contact DC may be disposed in the third recess 7. The second contact DC may penetrate the interlayer dielectric pattern 5, and may have electrical connection with the first impurity regions 112a disposed in portions of the active sections ACT of the substrate 100. The second contact DC may have a bottom surface at a higher level than that of the top surface of the word line WL. Therefore, the second contact DC may electrically connect the first impurity regions 112a to a bit line BL which will be discussed below, without contacting the word line WL. The second contact DC may include or may be formed of a conductive material. For example, the second contact DC may include or may be formed of impurity-doped polycrystalline. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Bit lines BL may be disposed on the cell array region CAR and the second interface region INT2 of the substrate 100. The bit lines BL are not disposed on the first interface region INT1. For example, the second interface region INT2 may correspond to a region of the substrate 100 between a distal end of the cell array region CAR and distal ends of the bit lines BL that extend away from the cell array region CAR. In an embodiment, the second interface region INT2 may correspond to a region of the substrate 100 which is not provided with the active sections ACT, but on which the bit lines BL are disposed. The bit lines BL may be disposed on the interlayer dielectric pattern 5. The bit lines BL may extend across the word-line capping patterns 110 and the word lines WL. For example, as shown in FIG. 1A, the bit lines BL may extend in the second direction D2 that intersects the first and third directions D1 and D3. The bit lines BL may extend onto a plurality of second contacts DC arranged in the second direction D2. The bit lines BL may be electrically connected to the second contacts DC. The first direction D1, the second direction D2, and the third direction D3 may be on the same plane which is parallel to a bottom surface of the substrate 100.

The bit lines BL may each include a first conductive pattern 130, a second conductive pattern 131, and a third conductive pattern 132 that are sequentially stacked. The first conductive pattern 130 may include or may be formed of impurity-doped or impurity-undoped polycrystalline silicon. The second conductive pattern 131 may include or may be formed of a metal silicide layer. The third conductive pattern 132 may include or may be formed of metal or conductive metal nitride. For example, the metal may include one or more of tungsten, titanium, tantalum, aluminum, copper, nickel, and cobalt, and the conductive metal nitride may include one or more of titanium nitride, tantalum nitride, and tungsten nitride.

Dielectric patterns 137 may be disposed on corresponding bit lines BL. The dielectric patterns 137 may extend in the second direction D2 along the bit lines BL, and may cover top surfaces of the bit lines BL. The dielectric patterns 137 may extend from the cell array region CAR onto the second interface region INT2 and the first interface region INT1. The dielectric patterns 137 may include or may be formed of a dielectric material. For example, the dielectric patterns 137 may include or may be formed of one or more of nitride and oxynitride. For example, the nitride may include silicon nitride, and the oxynitride may include silicon oxynitride.

When the semiconductor device is viewed in a plan view, the dielectric patterns 137 may include first parts 137L that overlap the word lines WL and second parts 137H that do not overlap the word lines WL. The first and second parts 137L and 137H may be connected to each other and thus may have no distinguishable boundary therebetween. As shown in FIG. 1B, the first and second parts 137L and 137H of the dielectric patterns 137 may have different heights from each other. For example, as illustrated in FIG. 1B, the second parts 137H of the dielectric patterns 137 may have their heights H3 greater than heights H4 of the first parts 137L of the dielectric patterns 137. On the second interface region INT2, the dielectric patterns 137 may have their recesses R that expose the top surfaces of the bit lines BL. When the semiconductor device is viewed in a plan view, the recesses R may overlap the bit lines BL. The recesses R may be spaced apart from each other in the third direction D3. On the first interface region INT1, the dielectric patterns 137 may be disposed on the device isolation pattern 102. For example, the dielectric patterns 137 may be disposed on the top surface of the device isolation pattern 102 between the second recesses GRV2. The dielectric patterns 137 may have their heights that are smaller on the first interface region INT1 than on the second interface region INT2.

A cell buried dielectric pattern 141 may be disposed on the cell array region CAR. For example, the cell buried dielectric pattern 141 may be disposed in the third recess 7. The cell buried dielectric pattern 141 may fill a space between the second contact DC and an inner wall of the third recess 7. The cell buried dielectric pattern 141 may be formed of a single or multiple layer including at least one selected from a silicon oxide layer, a silicon nitride layer, and a silicon oxynitride layer. Although not shown, a cell dielectric liner may be interposed between the cell buried dielectric pattern 141 and the inner wall of the third recess 7 and between the cell buried dielectric pattern 141 and the second contact DC. The cell dielectric liner may include a dielectric material having etch selectivity with respect to the cell buried dielectric pattern 141. For example, the cell buried dielectric pattern 141 may include or may be formed of a silicon nitride layer, and the cell dielectric liner may include or may be formed of a silicon oxide layer.

First contacts BC may be disposed on the cell array region CAR of the substrate 100. The first contacts BC may be disposed on neither the first interface region INT1 nor the second interface region INT2 of the substrate 100. For example, the first contacts BC may be disposed between a pair of neighboring bit lines BL. The first contacts BC may be disposed spaced apart from each other in the second and third directions D2 and D3. A plurality of first contacts BC may be arranged in the second and third directions D2 and D3. The first contacts BC may have their lower portions buried in the active sections ACT of the substrate 100. The first contacts BC may be electrically connected to the second impurity regions 112b disposed on end portions of the active sections ACT. The first contacts BC may include or may be formed of impurity-doped polycrystalline silicon or impurity-undoped polycrystalline silicon.

Insulation fences 40 may be disposed on the substrate 100. The insulation fences 40 may be disposed on the cell array region CAR, the first interface region INT1, and the second interface region INT2 of the substrate 100. The insulation fences 40 may be disposed between the first contacts BC. When the semiconductor device is viewed in a plan view, the insulation fences 40 may overlap the word lines WL. On the cell array region CAR, the insulation fences 40 and the first contacts BC may be disposed alternately along the second direction D2. For example, on the cell array region CAR, the first contacts BC and the insulation fences 40 are alternately and repeatedly disposed along a sidewall of the bit line BL in the second direction D2. The insulation fences 40 may include or may be formed of a dielectric material. For example, the dielectric material may include or may be formed of silicon nitride, silicon oxide, or silicon oxynitride. The insulation fences 40 may have their top ends whose heights (levels) are higher than those of top ends of the first contacts BC.

Referring to FIGS. 1B and 1C, spacer structures SP may be correspondingly disposed on sidewalls of the bit lines BL. The spacer structures SP may extend in the second direction D2 along the bit lines BL. The spacer structures SP may extend toward the first interface region INT1 beyond the distal ends of the bit lines BL. Therefore, the spacer structures SP may be disposed on both the interface region INT and the cell array region CAR of the substrate 100.

The spacer structures SP may each include a first spacer 21, an air gap AG, and a second spacer 25. The first spacer 21 and the second spacer 25 may be interposed between the first contact BC and the bit line BL. On the cell array region CAR and the second interface region INT2 of the substrate 100, the first spacer 21 may cover a sidewall of the dielectric pattern 137 and a sidewall of the bit line BL. The second spacer 25 may be adjacent to the first contact BC. The first spacer 21 may be spaced apart from the second spacer 25. The air gap AG may be disposed between the first spacer 21 and the second spacer 25. The first spacer 21, the air gap AG, and the second spacer 25 may extend along a lateral surface (i.e., a sidewall) of the bit line BL, thereby being interposed between the bit line BL and the insulation fence 40. The air gap AG may have a top end whose height (level) is higher than that of a top surface of the bit line BL.

On the cell array region CAR, the second spacer 25 may have a bottom surface lower than that of the first spacer 21. The second spacer 25 may have a top end whose height (level) is lower than that of a top end of the first spacer 21. Therefore, the first spacer 21 may have an exposed upper sidewall. Accordingly, it may be possible to increase a formation margin for landing pads LP which will be discussed below and to assist connection between the landing pad LP and the first contact BC. The first spacer 21 may extend to cover a sidewall of the second contact DC, and a sidewall and a bottom surface of the third recess 7. For example, the first spacer 21 may be interposed between the second contact DC and the cell buried dielectric pattern 141, between the word-line capping pattern 110 and the cell buried dielectric pattern 141, between the substrate 100 and the cell buried dielectric pattern 141, and between the device isolation pattern 102 and the cell buried dielectric pattern 141.

On the first interface region INT1, the first spacer 21 may cover a sidewall of the dielectric pattern 137 and a sidewall of the second recesses GRV2. The second spacer 25 may be disposed spaced apart from the first spacer 21 across the air gap AG. On the second interface region INT2, the first and second spacers 21 and 25 may have their bottom surfaces at the same level. The second spacer 25 may have a top surface that covers the sidewall of the dielectric pattern 137 and the sidewall of the bit line BL. Between separation patterns 144, the first spacer 21 may have a height greater than that of the second spacer 25. The first spacer 21 and the second spacer 25 may include or may be formed of the same material. For example, the first spacer 21 and the second spacer 25 may include or may be formed of a silicon nitride layer.

A storage node ohmic layer 9 may be disposed on the first contact BC. The storage node ohmic layer 9 may include or may be formed of metal silicide. A diffusion break pattern 11 may be disposed on the substrate 100. On the cell array region CAR, the diffusion break pattern 11 may conformally cover the storage node ohmic layer 9 and the first and second spacers 21 and 25. On the first interface region INT1, the diffusion break pattern 11 may conformally cover the spacer structures SP, top surfaces of the dielectric patterns 137, and top surfaces 32a of first sacrificial semiconductor patterns 32 which will be discussed below. On the second interface region INT2, the diffusion break pattern 11 may conformally cover the spacer structures SP, inner wall of the recesses R, top surfaces of the bit lines BL exposed to the recesses R, and top surfaces of second sacrificial semiconductor patterns 34 which will be discussed below. The diffusion break pattern 11 may include or may be formed of metal nitride, such as a titanium nitride layer or a tantalum nitride layer.

Landing pads LP may be disposed on the cell array region CAR and the interface region INT of the substrate 100. The landing pads LP may be disposed on the diffusion break pattern 11. The landing pads LP may have their top surfaces at the same level. The landing pads LP may include or may be formed of a metallic material, for example, tungsten. The landing pads LP may be spaced apart from each other across the separation pattern 144. On the cell array region CAR, the landing pads LP may have their upper portions that cover corresponding top surfaces of the dielectric patterns 137. The top surface of the landing pad LP may have a width greater than that of the top surface of the first contact BC. The landing pad LP may have a center that is not vertically aligned with that of the first contact BC. The landing pads LP may partially cover the insulation fences 40. A portion of the bit line BL may vertically overlap the landing pad LP.

On the first interface region INT1, the landing pads LP may be disposed on the diffusion break pattern 11. The landing pads LP may extend into and fill the second recesses GRV2. The upper portion of the landing pad LP may cover an upper portion of the dielectric pattern 137. On the second interface region INT2, the landing pads LP may be disposed on the diffusion break pattern 11. One LPa of the landing pads LP may extend into and fill the recesses R. In this case, the landing pad LPa may be electrically connected to an exposed bit line BL.

The separation pattern 144 may be disposed between the landing pads LP. The separation pattern 144 may electrically insulate the landing pads LP from each other. The separation pattern 144 may include or may be formed of a dielectric material. For example, the separation pattern 144 may include or may be formed of one or more of silicon oxide and silicon nitride. The separation pattern 144 may have a top surface coplanar with those of the landing pads LP. The separation pattern 144 may define planar shapes of the landing pads LP.

On the cell array region CAR, data storage elements (e.g., capacitors) may be disposed on the landing pads LP. Each of the data storage elements may include a bottom electrode BE, a dielectric layer, and a top electrode. When the semiconductor device is viewed in a plan view, the bottom electrode BE may overlap the landing pad LP. The bottom electrode BE and the first contact BC may be electrically connected to each other through the landing pad LP.

First sacrificial semiconductor patterns 32 and second sacrificial semiconductor patterns 34 may be disposed on the interface region INT of the substrate 100. For example, the first sacrificial semiconductor patterns 32 may be disposed on the first interface region INT1, and the second sacrificial semiconductor patterns 34 may be disposed on the second interface region INT2. The first and second sacrificial semiconductor patterns 32 and 34 may include or may be formed of polycrystalline silicon. For example, the first and second sacrificial semiconductor patterns 32 and 34 may include or may be formed of impurity-undoped polycrystalline silicon. The present inventive concepts, however, are not limited thereto, and the first and second sacrificial semiconductor patterns 32 and 34 may include or may be formed of various materials having etch selectivity with respect to silicon oxide.

On the first interface region INT1, the first sacrificial semiconductor patterns 32 may be disposed in the second recesses GRV2. As the second recesses GRV2 have their widths that decrease as approaching the top surface of the substrate 100, the first sacrificial semiconductor patterns 32 may have their widths W1 that decrease as approaching the top surface of the substrate 100. Therefore, when the semiconductor device is viewed in a cross-section view, the first sacrificial semiconductor patterns 32 may have substantially triangular shapes. The first sacrificial semiconductor patterns 32 may each have a height H1 ranging from about 200 Å to about 800 Å. A value of about 0.3 to about 0.8 may be given as a ratio of the height H1 of the first sacrificial semiconductor pattern 32 to a height of the second recesses GRV2. When the semiconductor device is viewed in a plan view, the first sacrificial semiconductor patterns 32 may be spaced apart from each other in the third direction D3 across the dielectric patterns 137. The first sacrificial semiconductor patterns 32 and the dielectric patterns 137 may be alternately and repeatedly disposed along the third direction D3. The first sacrificial semiconductor patterns 32 may be spaced apart from each other in the second direction D2 across the insulation fences 40. The first sacrificial semiconductor patterns 32 and the insulation fences 40 may be alternately and repeatedly disposed along the second direction D2. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

On the second interface region INT2, the second sacrificial semiconductor patterns 34 may be disposed on the interlayer dielectric pattern 5. For example, the second sacrificial semiconductor patterns 34 may be correspondingly disposed between the spacer structures SP. The second sacrificial semiconductor patterns 34 may have widths W2 at their upper portions substantially the same as widths W2 at their lower portions. The widths W2 of the second sacrificial semiconductor patterns 34 may be greater than the widths W1 of the first sacrificial semiconductor patterns 32. The second sacrificial semiconductor patterns 34 may have their top surfaces 34a at the same level as that of top surfaces 32a of the first sacrificial semiconductor patterns 32. The second sacrificial semiconductor patterns 34 may have their bottom surfaces at a higher level than that of lowermost portions of the first sacrificial semiconductor patterns 32. When the semiconductor device is viewed in a plan view, the second sacrificial semiconductor patterns 34 may be disposed spaced apart from each other in the third direction D3 across the bit lines BL. The second sacrificial semiconductor patterns 34 and the bit lines BL may be alternately and repeatedly disposed along the third direction D3. The second sacrificial semiconductor patterns 34 may be disposed spaced apart from each other in the second direction D2 across the insulation fences 40. The second sacrificial semiconductor patterns 34 and the insulation fences 40 may be alternately and repeatedly disposed along the second direction D2. The second sacrificial semiconductor patterns 34 may have their sidewalls vertically aligned with those of the spacer structures SP.

[Fabrication Method]

FIGS. 2A to 10A illustrate plan views showing a method of fabricating a semiconductor memory device according to some example embodiments of the present inventive concepts. FIGS. 2B to 10B illustrate cross-sectional views taken along lines I-I' and II-II' of FIGS. 2A to 10A. FIGS. 2C to 10C illustrate cross-sectional views taken along lines III-III' and IV-IV' of FIGS. 2A to 10A.

Figure 2A:
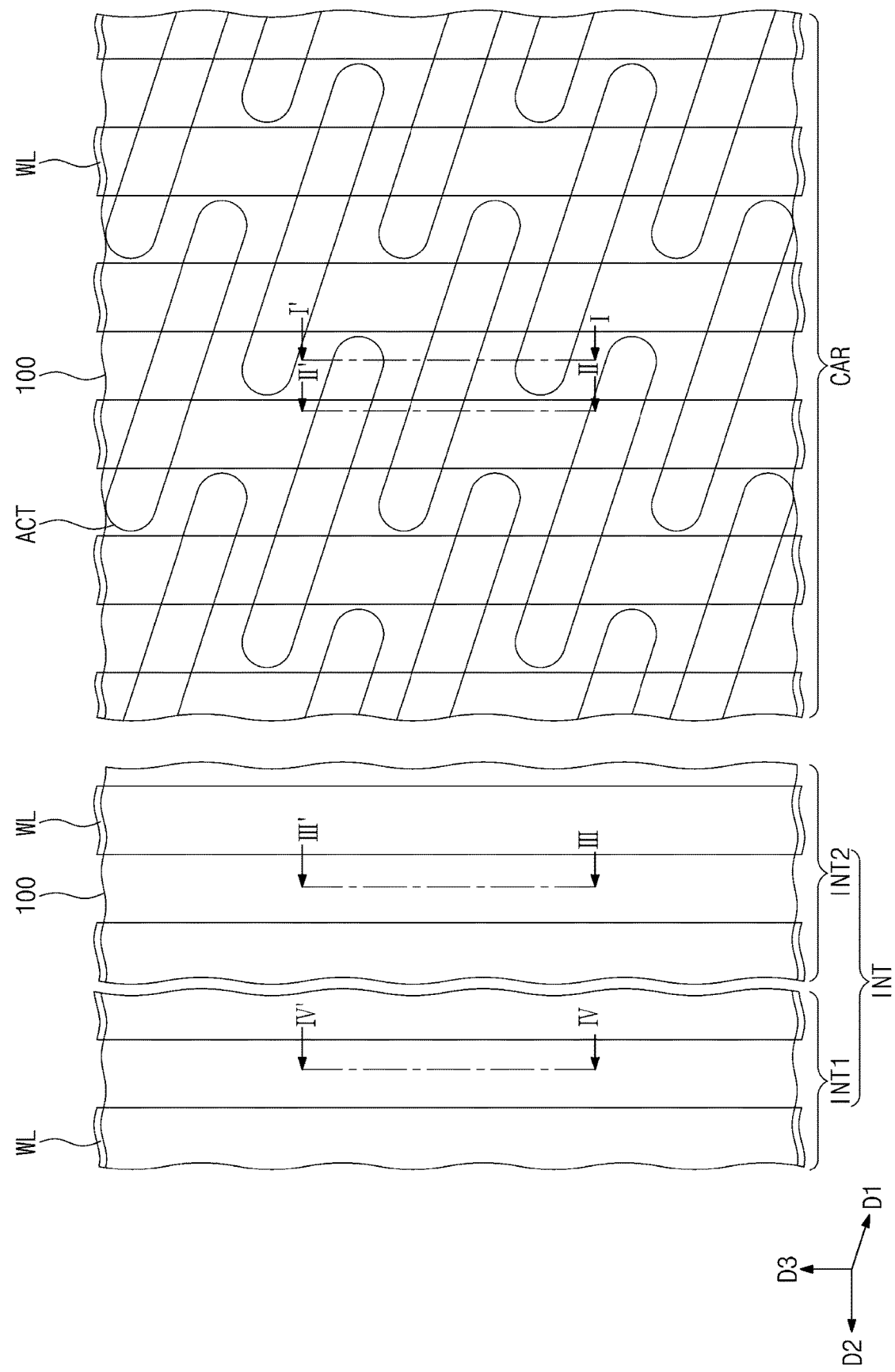
Figure 2B:
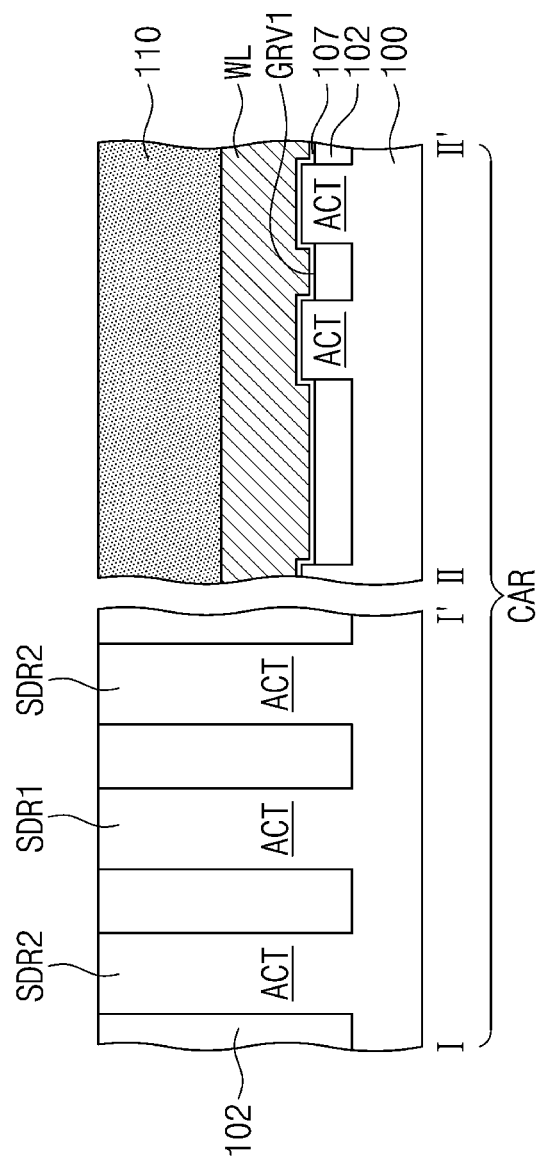
Figure 2C:
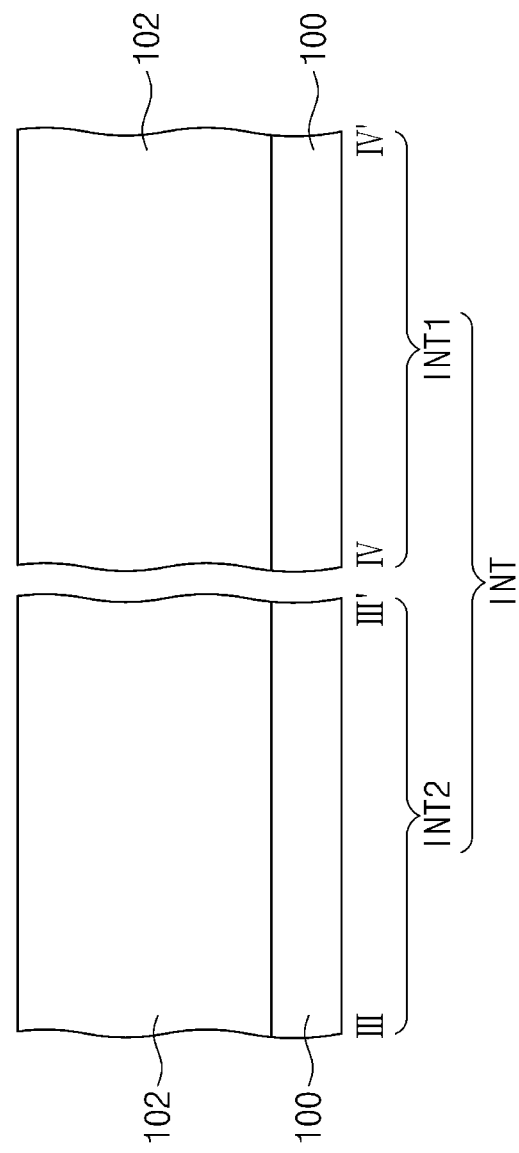

Referring to FIGS. 2A to 2C, a substrate 100 may be provided which has a cell array region CAR, a first interface region INT1, and a second interface region INT2. Active sections ACT may be provided with the substrate 100, and may be defined by a device isolation pattern 102 on the cell array region CAR of the substrate 100. The device isolation pattern 102 may cover both the first and second interface regions INT1 and INT2 of the substrate 100. The active sections ACT may be formed on neither the first interface region INT1 nor the second interface region INT2. For example, a trench may be formed on the cell array region CAR of the substrate 100. The device isolation pattern 102 may fill the trench. The device isolation pattern 102 may include or may be formed of, for example, one or more of a silicon oxide layer, a silicon nitride layer, and a silicon oxynitride layer. When the semiconductor device is viewed in a plan view, the active sections ACT may be arranged in parallel to each other in a first direction D1. The active sections ACT and the device isolation pattern 102 on the cell array region CAR may be patterned to form first recesses GRV1 in which word lines WL will be formed. In an embodiment, each of the first recesses GRV1 may be a trench, extending in a third direction D3. When the first recesses GRV1 are formed, etching conditions for the substrate 100 and the device isolation pattern 102 may be adjusted to allow the device isolation pattern 102 to be etched (or recessed) more than the substrate 100. Therefore, the first recesses GRV1 may have uneven bottom surfaces. In an embodiment, each first recess GRV1 may have a bottom surface which is defined by top surfaces of the active sections ACT which is recessed and a top surface of the device isolation pattern 102 which is recessed. The top surface of the device isolation pattern 102 in the first recesses GRV1 may be more recessed than the top surfaces of the active sections ACT in the recess, thereby forming the uneven (e.g., a corrugated) bottom surface of each of the first recesses GRV1.

Word lines WL may be formed on the cell array region CAR, the first interface region INT1, and the second interface region INT2 of the substrate 100. The word lines WL may extend across the active sections ACT. A pair of word lines WL may extend across each of the active sections ACT. As shown in FIG. 2B, the pair of word lines WL may divide each of the active sections ACT into a first source/drain region SDR1 and a pair of second source/drain regions SDR2. The first source/drain region SDR1 may be defined between the pair of word lines WL, and the pair of second source/drain regions SDR2 may be defined on opposite end portions of each of the active sections ACT.

Before the word lines WL are formed, a dielectric layer 107 may be formed on inner walls and bottom surfaces of the first recesses GRV1. The dielectric layer 107 may be formed by one or more of thermal oxidation, chemical vapor deposition, and atomic layer deposition. The dielectric layer 107 may be formed of one or more dielectric materials, such as a silicon oxide layer, a silicon nitride layer, and a metal oxide layer. A gate conductive layer may be formed to fill the first recesses GRV1, and then the gate conductive layer may be etched to form the word lines WL. The gate conductive layer may be formed of, for example, one or more of impurity-doped polycrystalline silicon, metal nitride, and metal. The word lines WL may be recessed to have top surfaces lower than those of the active sections ACT. The word lines WL may be formed to extend in a third direction D3 that intersects the first direction D1. A dielectric layer, such as a silicon nitride layer, may be formed on the substrate 100 so as to fill the first recesses GRV1, and then the dielectric layer may be etched to form word-line capping patterns 110 on corresponding word lines WL. The word-line capping patterns 110 may extend in the third direction D3. The stacked structure of the word lines WL and the word-line capping patterns 110 may fill the first recesses GRV1.

Figure 3A:
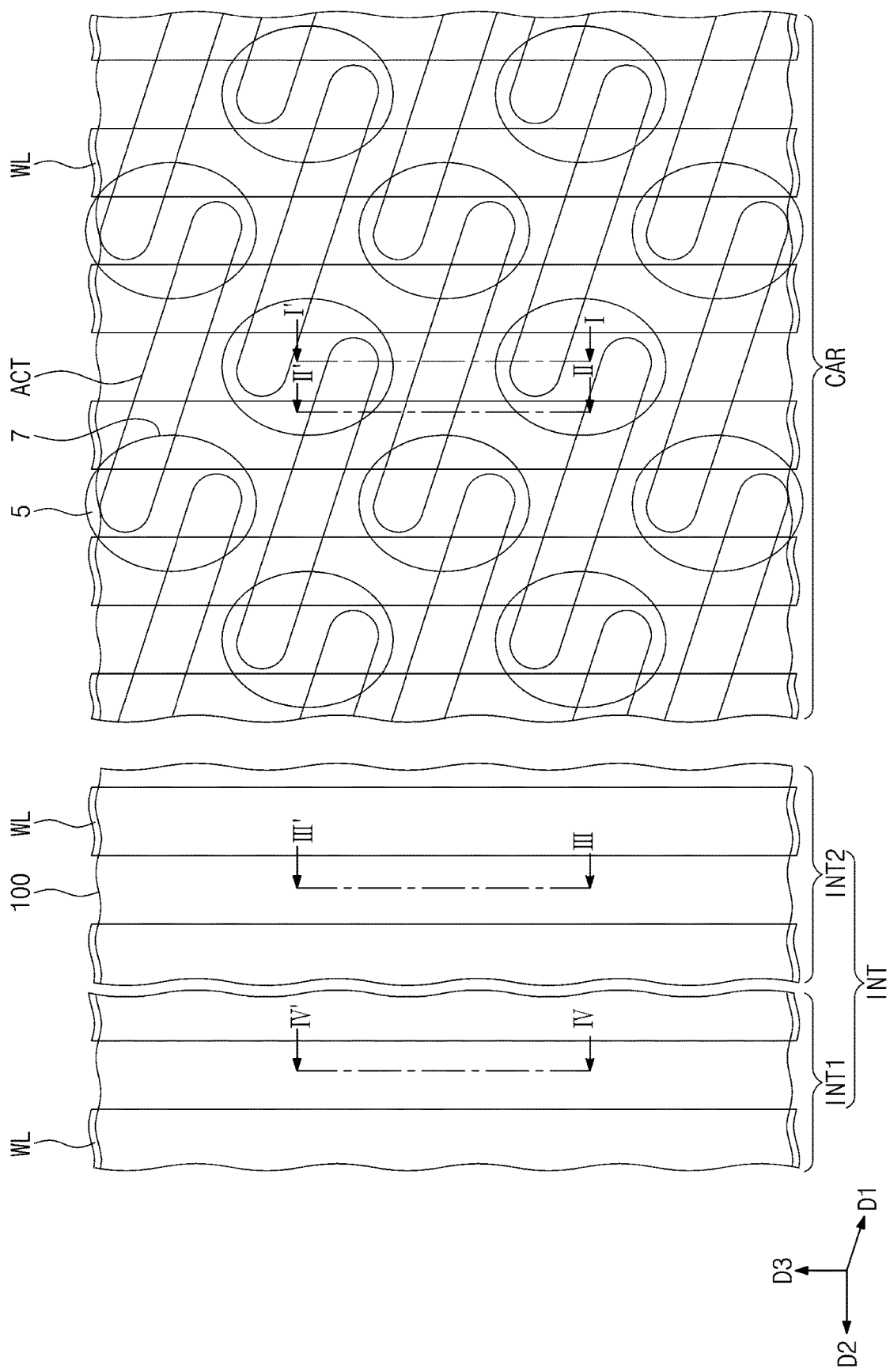
Figure 3B:
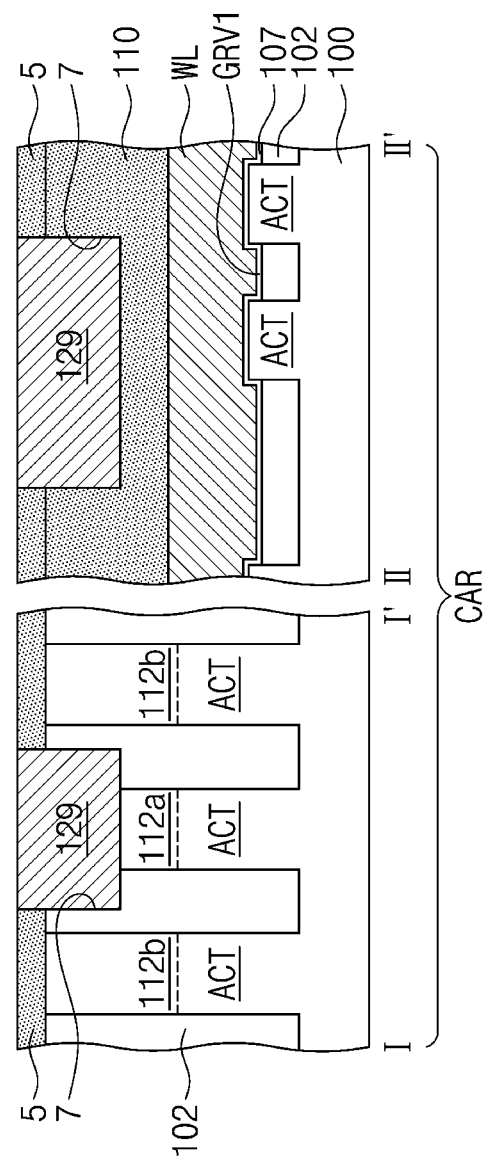
Figure 3C:
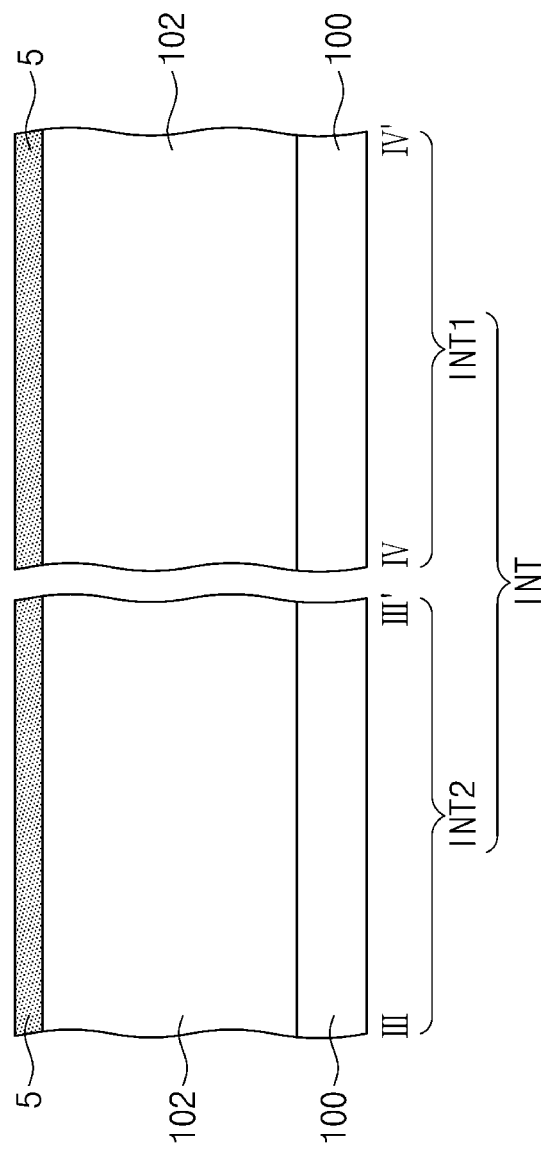

Referring to FIGS. 3A to 3C, the word-line capping patterns 110 and the device isolation pattern 102 may be used as a mask to dope impurities into the active sections ACT. Therefore, first and second impurity regions 112*a* and 112*b* may be formed in the active sections ACT. The first impurity region 112*a* and the second impurity regions 112*b* may be formed respectively in the first source/drain region SDR1 and the second source/drain regions SDR2 of FIG. 2B.

A dielectric layer may be formed on entire surfaces of the cell array region CAR, the first interface region INT1, and the second interface region INT2 of the substrate 100. The dielectric layer may be patterned to form an interlayer dielectric pattern 5 which exposes portions of the word-line capping patterns 110, portions of the active sections ACT, and portions of the device isolation pattern 102. A third recess 7 may be formed on the cell array region CAR of the substrate 100. The third recess 7 is not formed on the interface region INT of the substrate 100. The formation of the third recess 7 may include using the interlayer dielectric pattern 5 as an etching mask to etch the device isolation pattern 102, the substrate 100, and the word-line capping pattern 110. The interlayer dielectric pattern 5 may be a single or multiple layer including one or more of a silicon oxide layer, a silicon nitride layer, and a silicon oxynitride layer. The interlayer dielectric pattern 5 may be formed to have a plurality of island shapes that are spaced apart from each other. The interlayer dielectric pattern 5 may be formed to simultaneously cover end portions of two neighboring active sections ACT. The third recess 7 may be formed to have a net shape in a plan view. When the semiconductor device is viewed in a plan view, the third recess 7 may be a region other than the interlayer dielectric pattern 5. The third recess 7 may expose the first impurity regions 112*a*.

A polycrystalline silicon layer may be formed on an entire surface of the substrate 100, thereby filling the third recess 7. Afterwards, a planarization etching process may be performed on the polycrystalline silicon layer. The planarization etching process may be performed such that the polycrystalline silicon layer on the interlayer dielectric pattern 5 may be removed to expose a top surface of the interlayer dielectric pattern 5. Accordingly, a first polycrystalline silicon pattern 129 may be formed to fill the third recess 7.

Figure 4A:
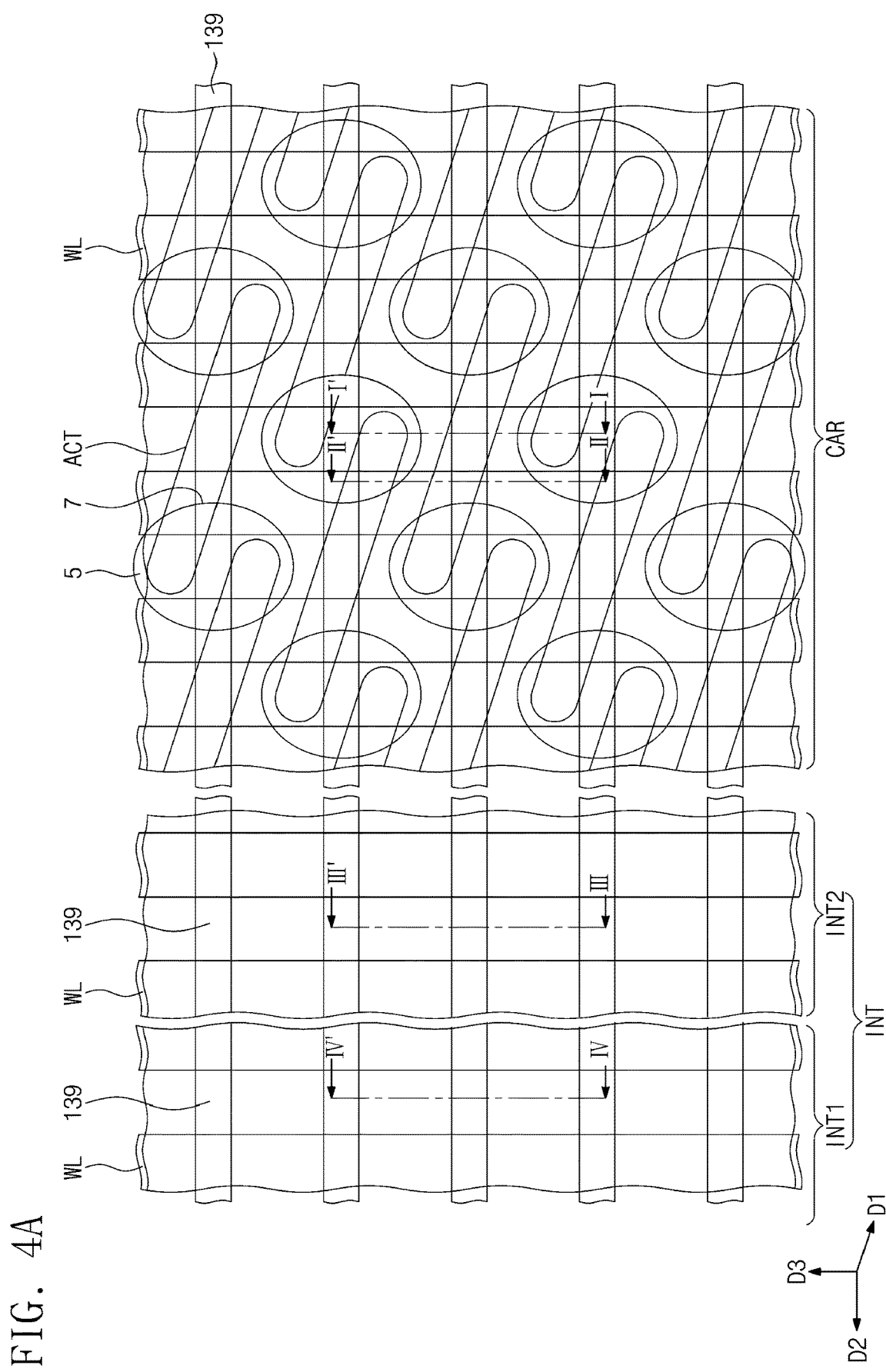
Figure 4B:
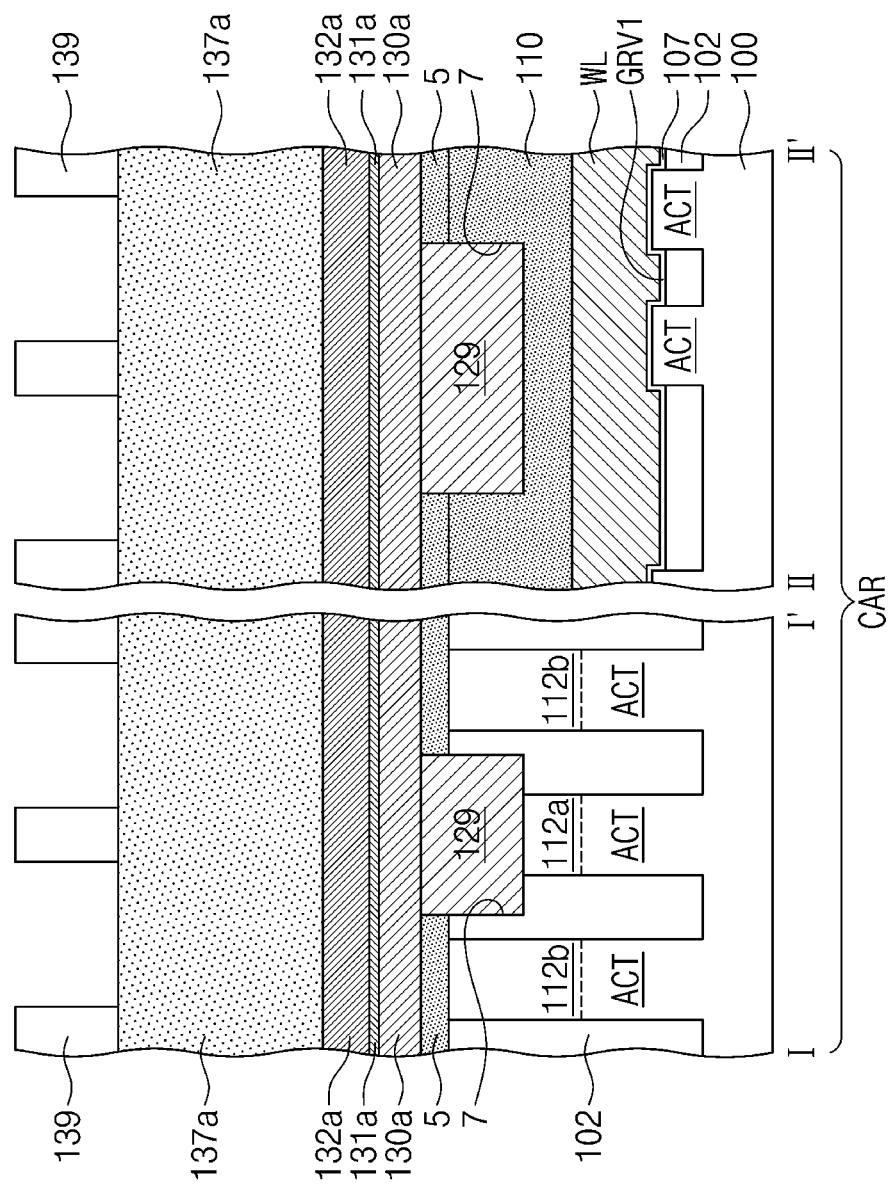
Figure 4C:
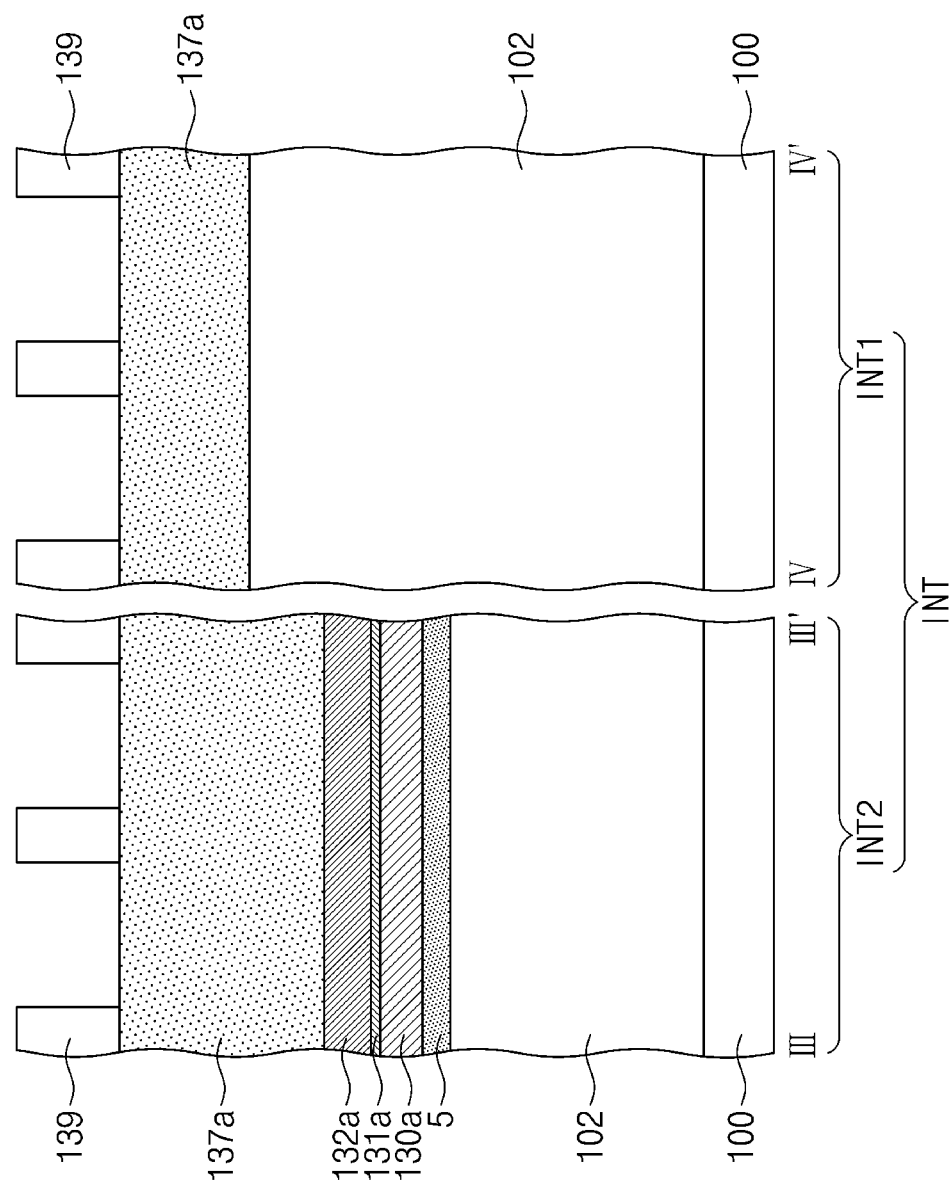

Referring to FIGS. 4A to 4C, a first conductive layer 130*a*, a second conductive layer 131*a*, and a third conductive layer 132*a* may be sequentially formed on the interlayer dielectric pattern 5 and the first polycrystalline silicon pattern 129. The first conductive layer 130*a*, the second conductive layer 131*a*, and the third conductive layer 132*a* may be formed on the entire surfaces of the cell array region CAR, the first interface region INT1, and the second interface region INT2 of the substrate 100. The first conductive layer 130*a* may include or may be formed of impurity-doped polycrystalline silicon. The second conductive layer 131*a* may include or may be formed of metal silicide, such as cobalt silicide. The second conductive layer 131*a* may be formed by depositing a metal layer on the first conductive layer 130*a* and the first polycrystalline silicon pattern 129, and then performing an annealing process. The annealing process may be performed such that the first conductive layer 130*a* and the first polycrystalline silicon pattern 129 may react with the metal layer to form a metal silicide layer. A non-reacted metal layer may be removed to form the second conductive layer 131*a*.

On the first interface region INT1, the interlayer dielectric pattern 5, the first conductive layer 130*a*, the second conductive layer 131*a*, and the third conductive layer 132*a* may be removed to expose a top surface of the device isolation pattern 102. A dielectric layer may be formed on the exposed top surface of the device isolation pattern 102. The dielectric layer may include the same material as that of the device isolation pattern 102. Therefore, the dielectric layer and the device isolation pattern 102 may be emerged to allow the device isolation pattern 102 to have a raised top surface. Thereafter, a preliminary dielectric pattern layer 137*a* may be formed on the entire surfaces of the cell array region CAR, the first interface region INT1, and the second interface region INT2 of the substrate 100. A planarization process may be performed on a top surface of the preliminary dielectric pattern layer 137*a*, and thus the top surface of the preliminary dielectric pattern layer 137*a* on the cell array region CAR may be located at the same level as that of the top surface of the preliminary dielectric pattern layer 137*a* on the interface region INT.

First mask patterns 139 may be formed on the preliminary dielectric pattern layer 137*a*, defining planar shapes of bit lines BL which will be discussed below. The first mask patterns 139 may be formed of a material, such as an amorphous carbon layer (ACL), a silicon oxide layer, or a photoresist pattern, having etch selectivity with respect to the preliminary dielectric pattern layer 137*a*. The first mask patterns 139 may extend in a second direction D2 that intersects the first and third directions D1 and D3.

Figure 5A:
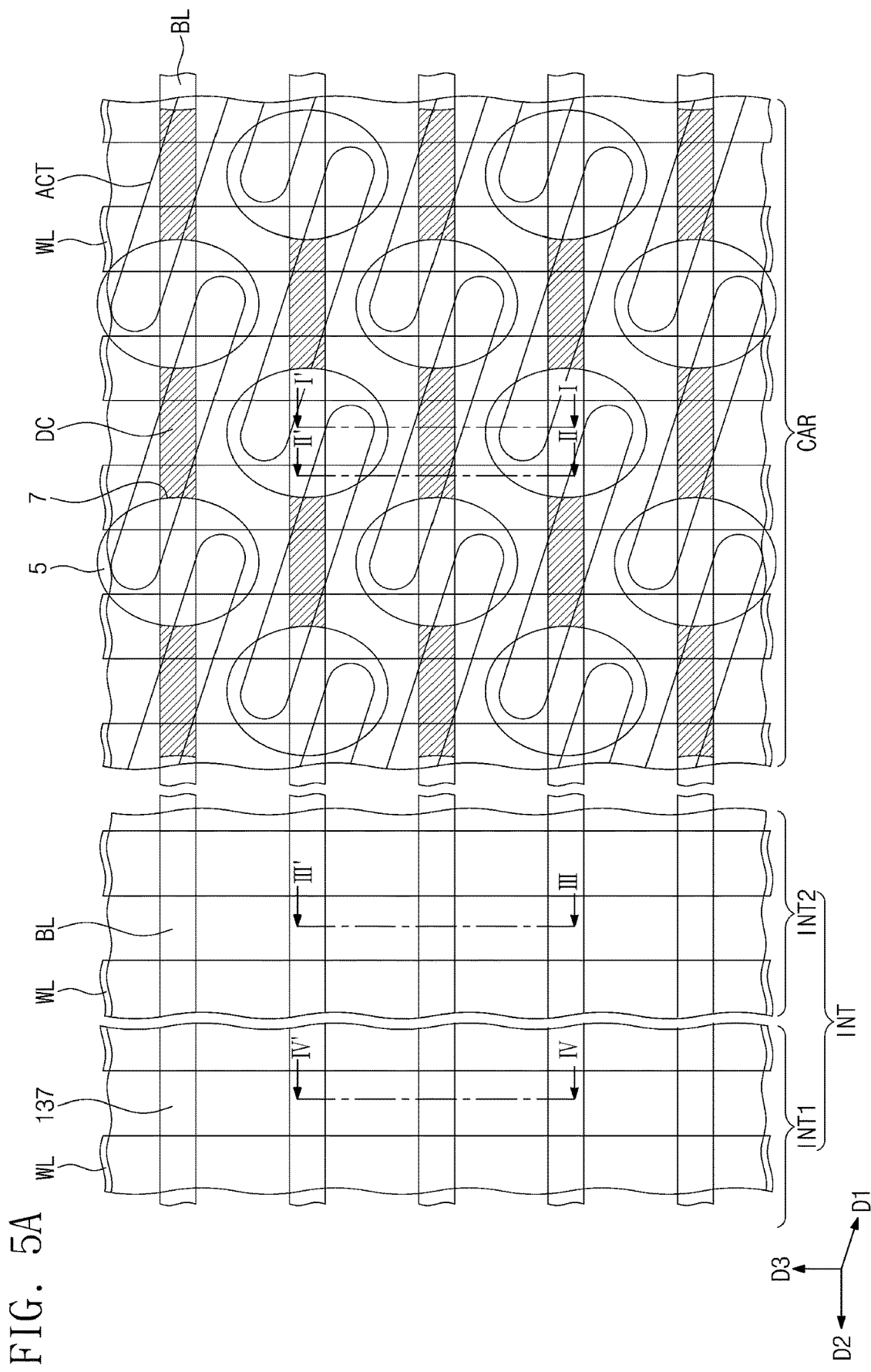
Figure 5B:
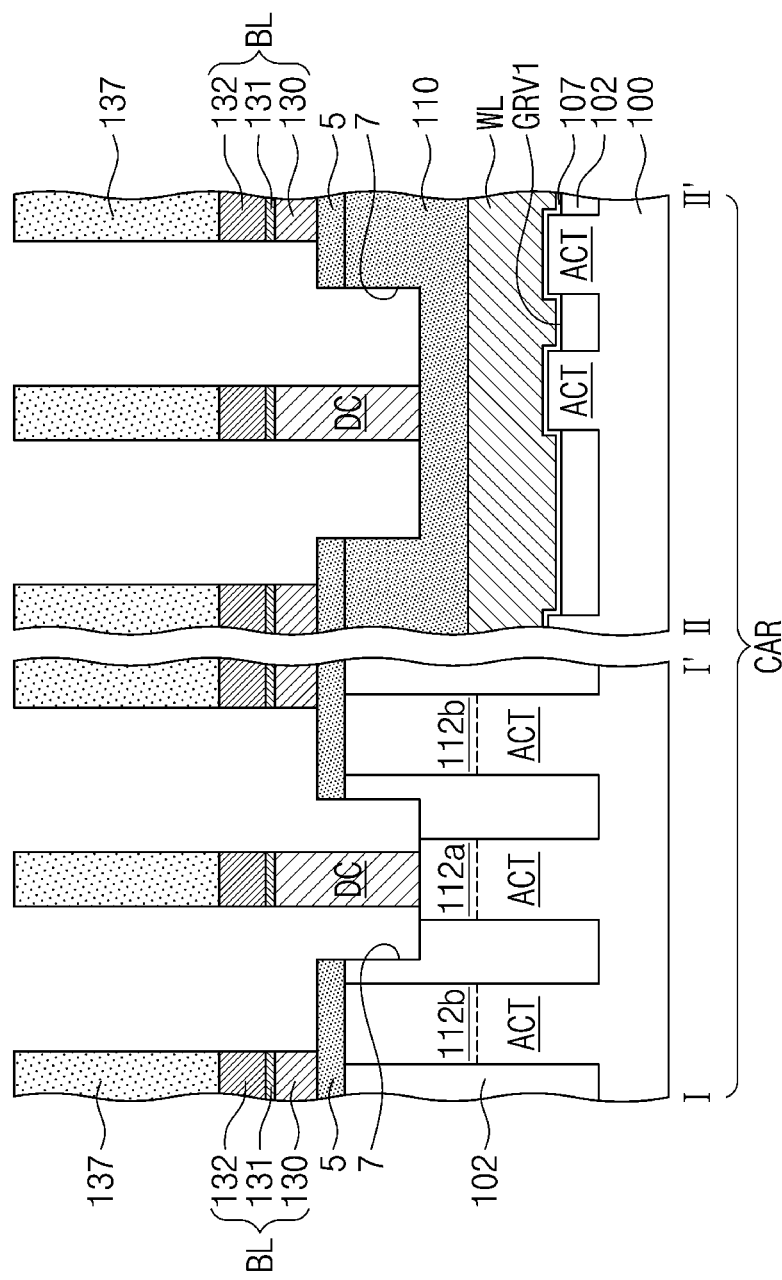
Figure 5C:
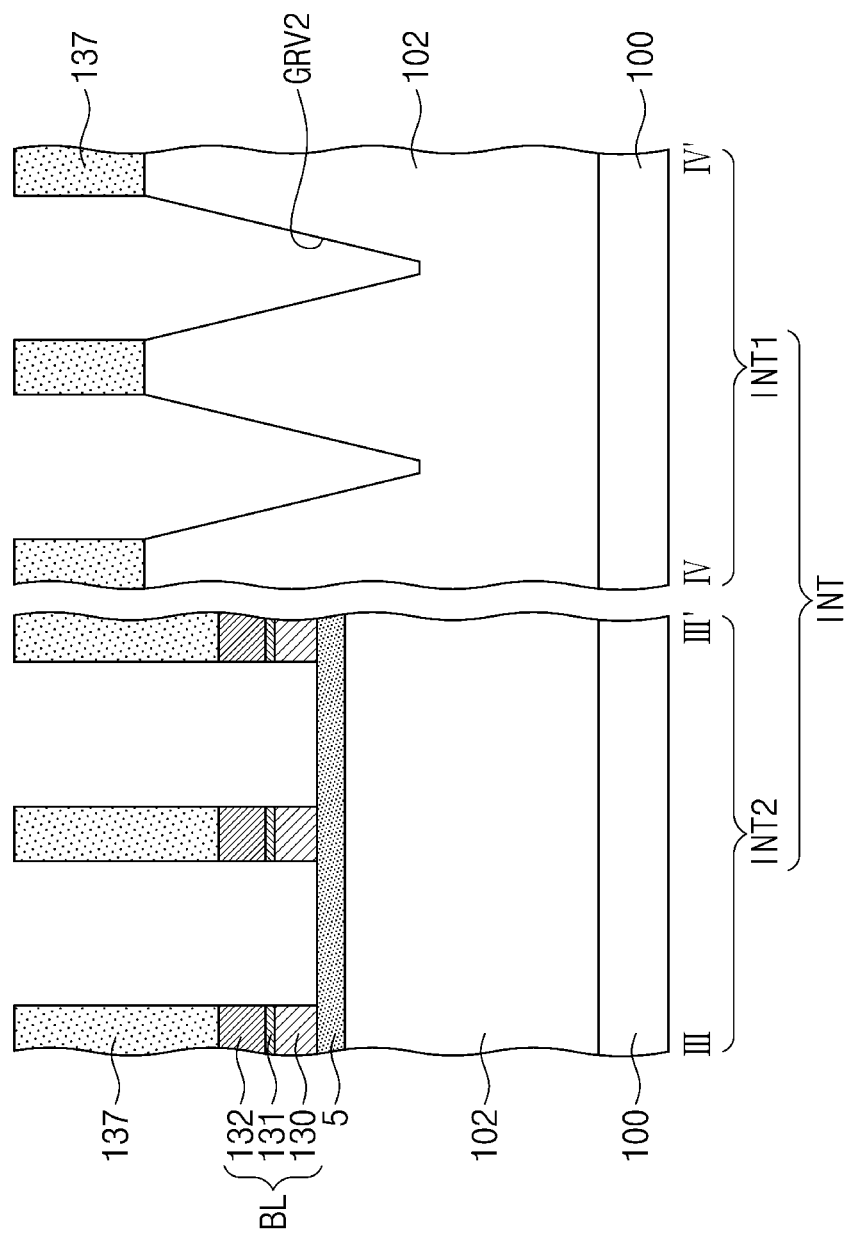

Referring to FIGS. 5A to 5C, on the cell array region CAR and the second interface region INT2, the first mask patterns 139 may be used as an etching mask to sequentially etch the preliminary dielectric pattern layer 137*a*, the third conductive layer 132*a*, the second conductive layer 131*a*, the first conductive layer 130*a*, and the first polycrystalline silicon pattern 129. Therefore, there may be formed dielectric patterns 137, second contacts DC, and bit lines BL. Each bit line BL may include a first conductive pattern 130, a second conductive pattern 131, and a third conductive pattern 132. The interlayer dielectric pattern 5 may have a partially exposed top surface, and the third recess 7 may have a partially exposed inner wall and bottom surface. On the first interface region INT1, the first mask patterns 139 may be used as an etching mask to etch the preliminary dielectric pattern layer 137*a* and the device isolation pattern 102. Therefore, the device isolation pattern 102 may have second recesses GRV2, and the dielectric patterns 137 may be formed on the device isolation pattern 102. The second recesses GRV2 may have their widths that decrease as approaching a top surface of the substrate 100. Thereafter, the first mask patterns 139 may be removed.

Figure 6A:
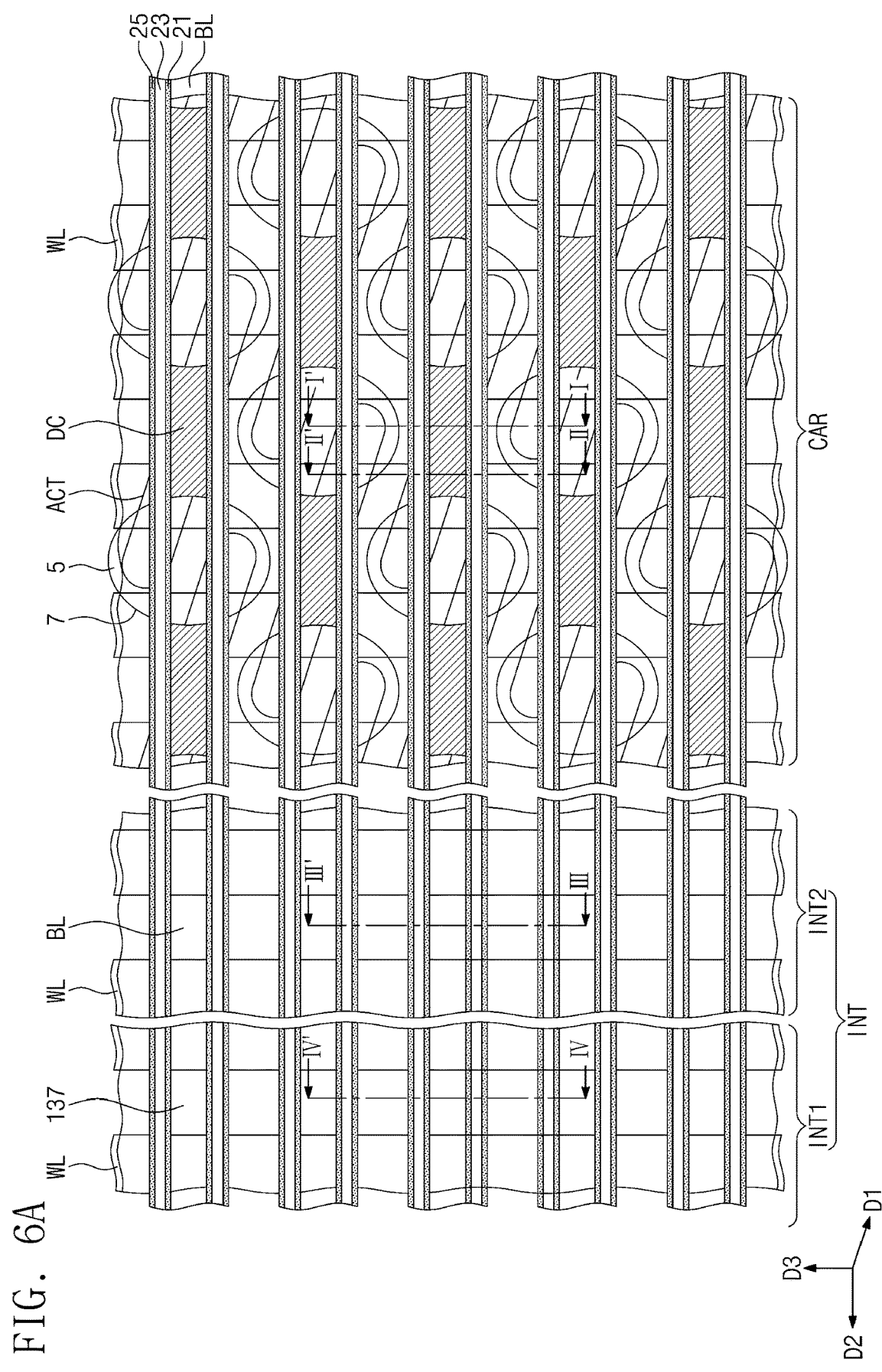
Figure 6B:
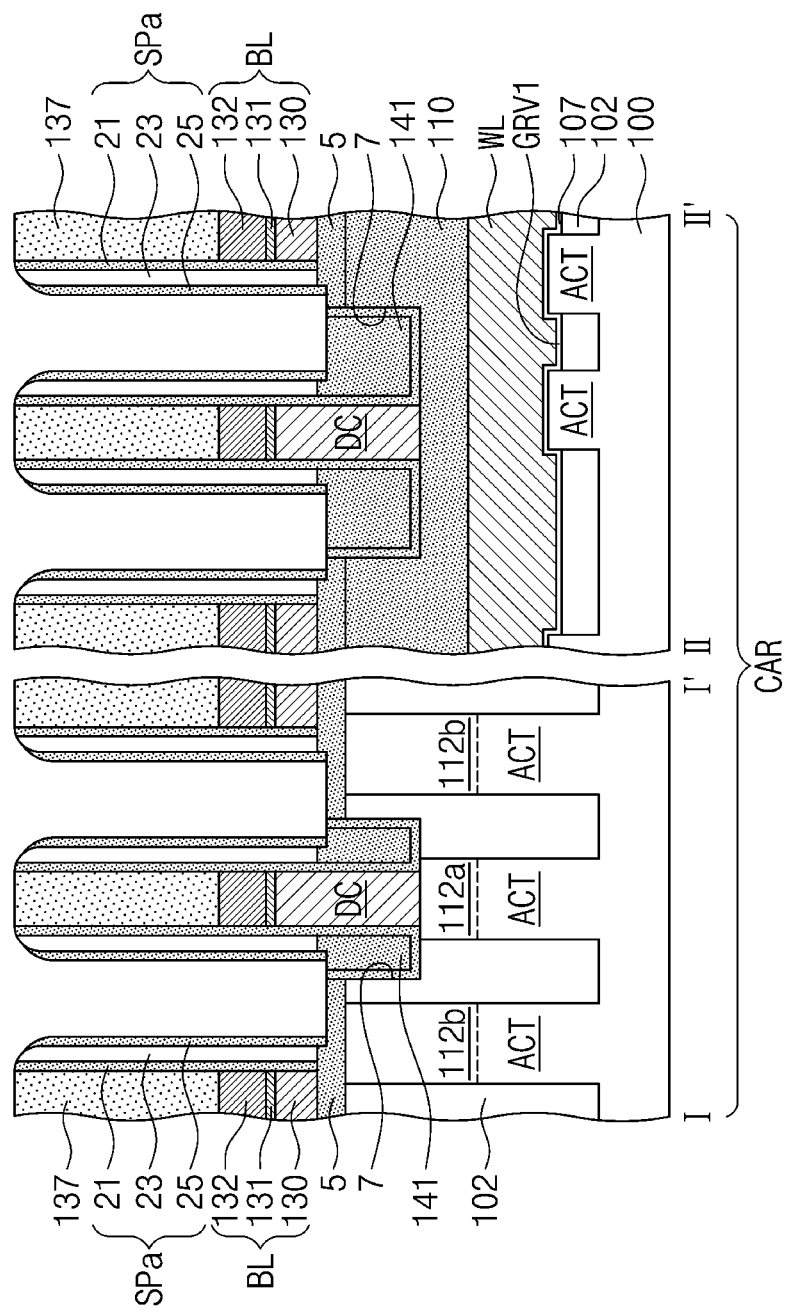
Figure 6C:
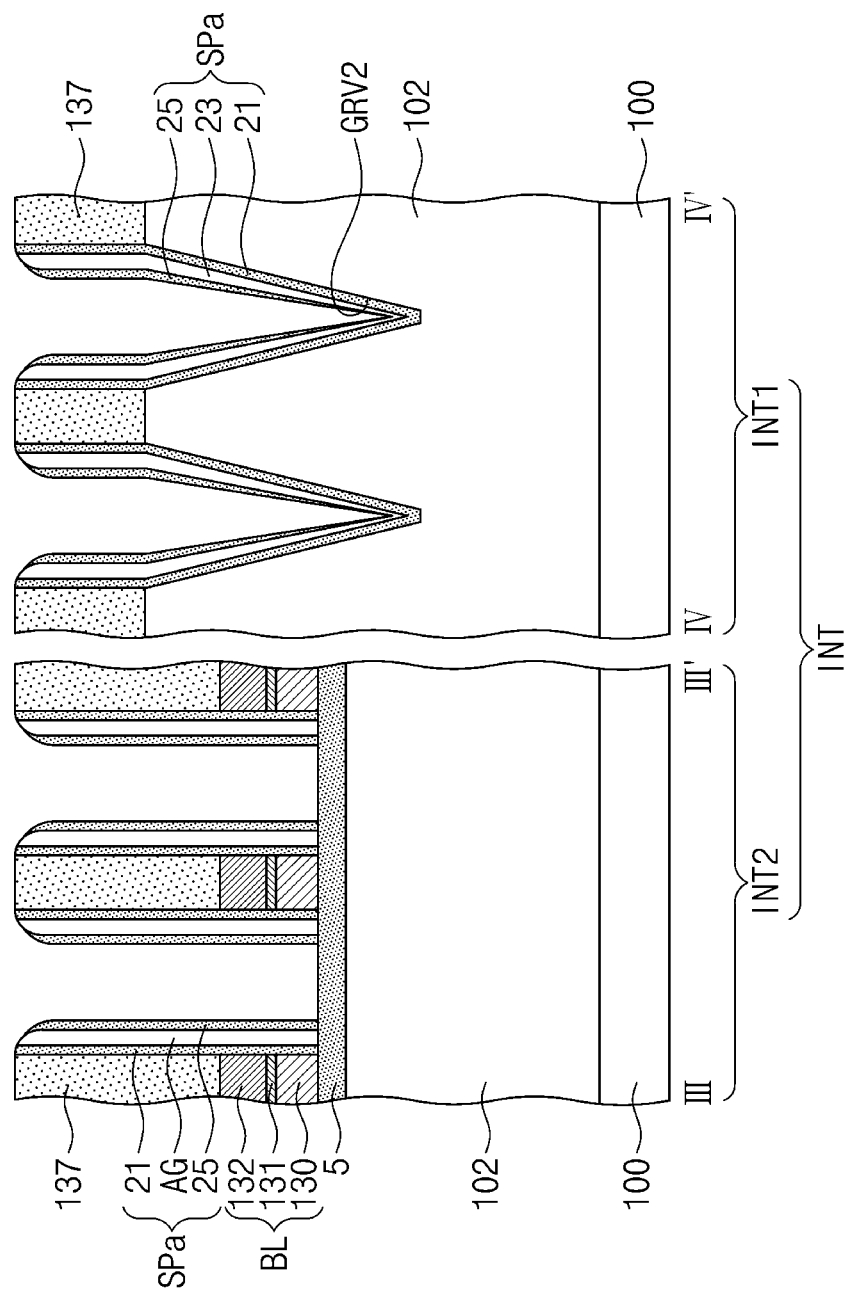

Referring to FIGS. 6A to 6C, a first spacer layer may be conformally formed on the entire surfaces of the cell array region CAR and the interface region INT of the substrate 100. On the cell array region CAR, the first spacer layer may conformally cover the bottom surface and the inner wall of the third recess 7. On the second interface region INT2, the first spacer layer may cover lateral surfaces of the bit lines BL, the top surface of the interlayer dielectric pattern 5, and lateral and top surfaces of the dielectric patterns 137. On the first interface region INT1, the first spacer layer may cover inner walls of the second recesses GRV2 and top and lateral surfaces of the dielectric patterns 137. For example, the first spacer layer may be a silicon nitride layer. A dielectric layer, such as a silicon nitride layer, may be formed on the cell array region CAR of the substrate 100 so as to fill the third recess 7, and then the dielectric layer may be anisotropically etched to form a cell buried dielectric pattern 141 in the third recess 7. In this step, the first spacer layer may also be etched to form a first spacer 21 on the cell array region CAR and the interface region INT. Therefore, the top surface of the interlayer dielectric pattern 5 may be exposed. A sacrificial spacer layer may be conformally formed on the entire surface of the substrate 100, and then the sacrificial spacer layer may be anisotropically etched to form a sacrificial spacer 23 that covers a sidewall of the first spacer 21. The sacrificial spacer 23 may be formed of a material, such as a silicon oxide layer, having etch selectivity with respect to the first spacer 21. A second spacer 25 may be formed to cover a sidewall of the sacrificial spacer 23. The second spacer 25 may be formed of, for example, a silicon nitride layer. The top surface of the interlayer dielectric pattern 5 may be exposed after the second spacer 25 is formed.

Figure 7A:
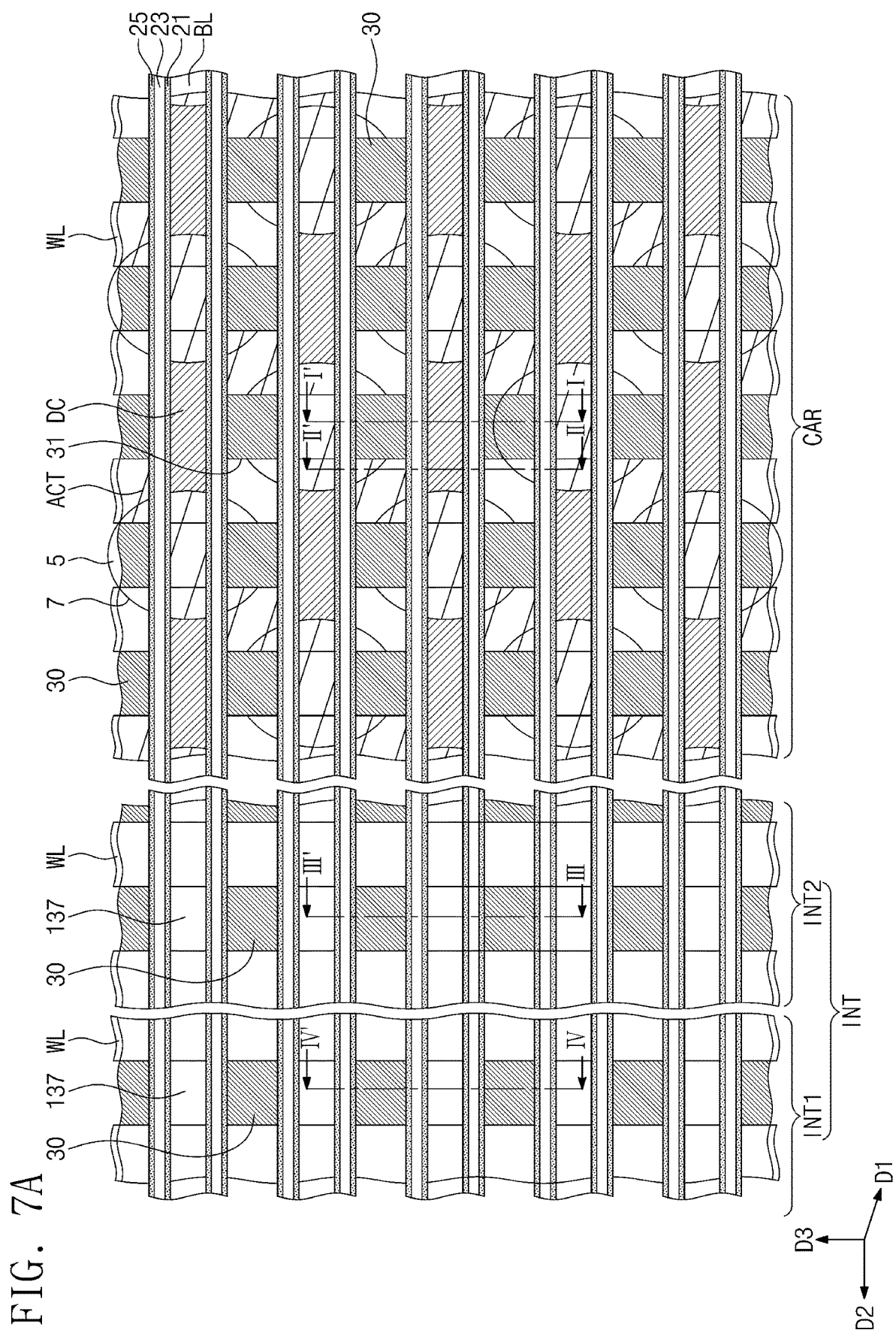
Figure 7B:
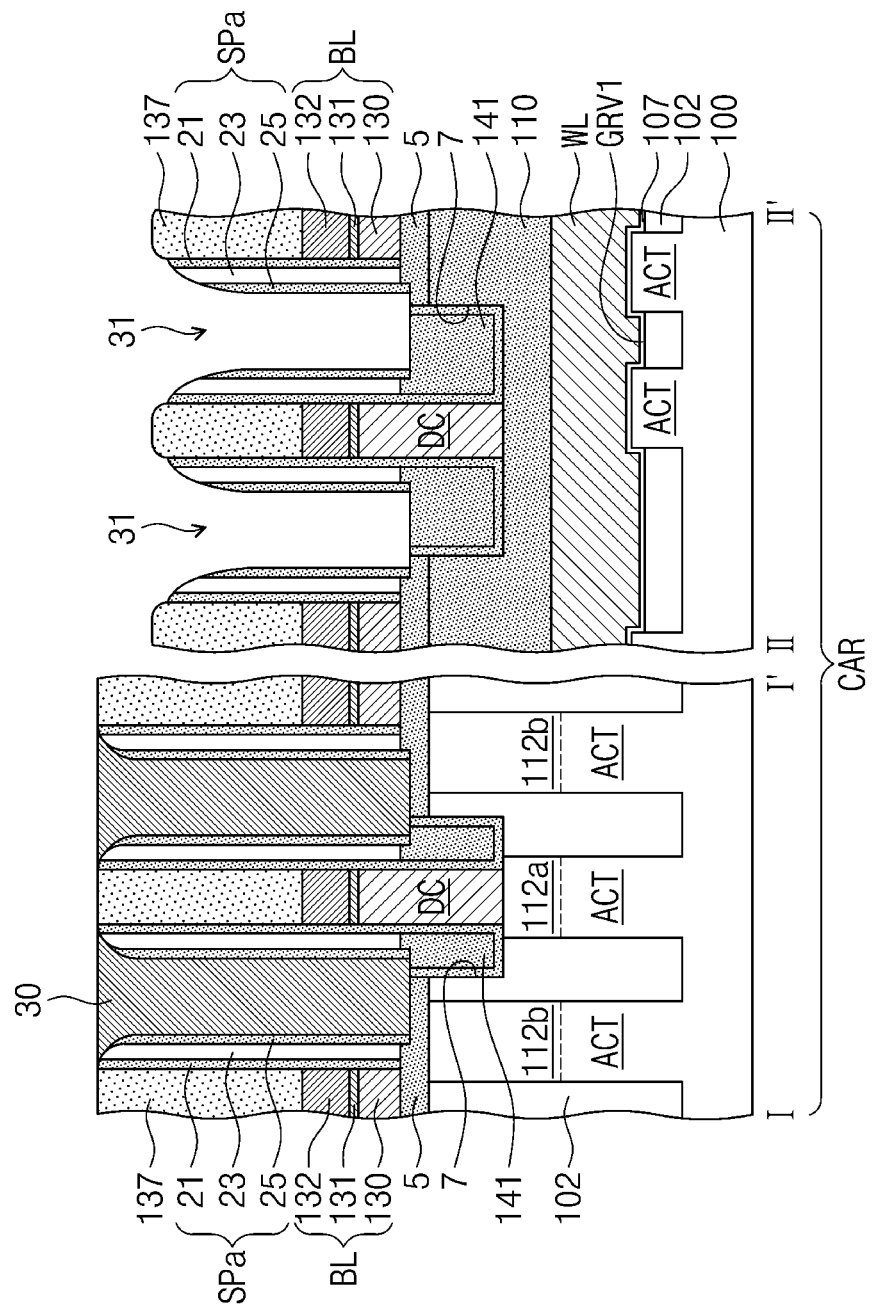
Figure 7C:
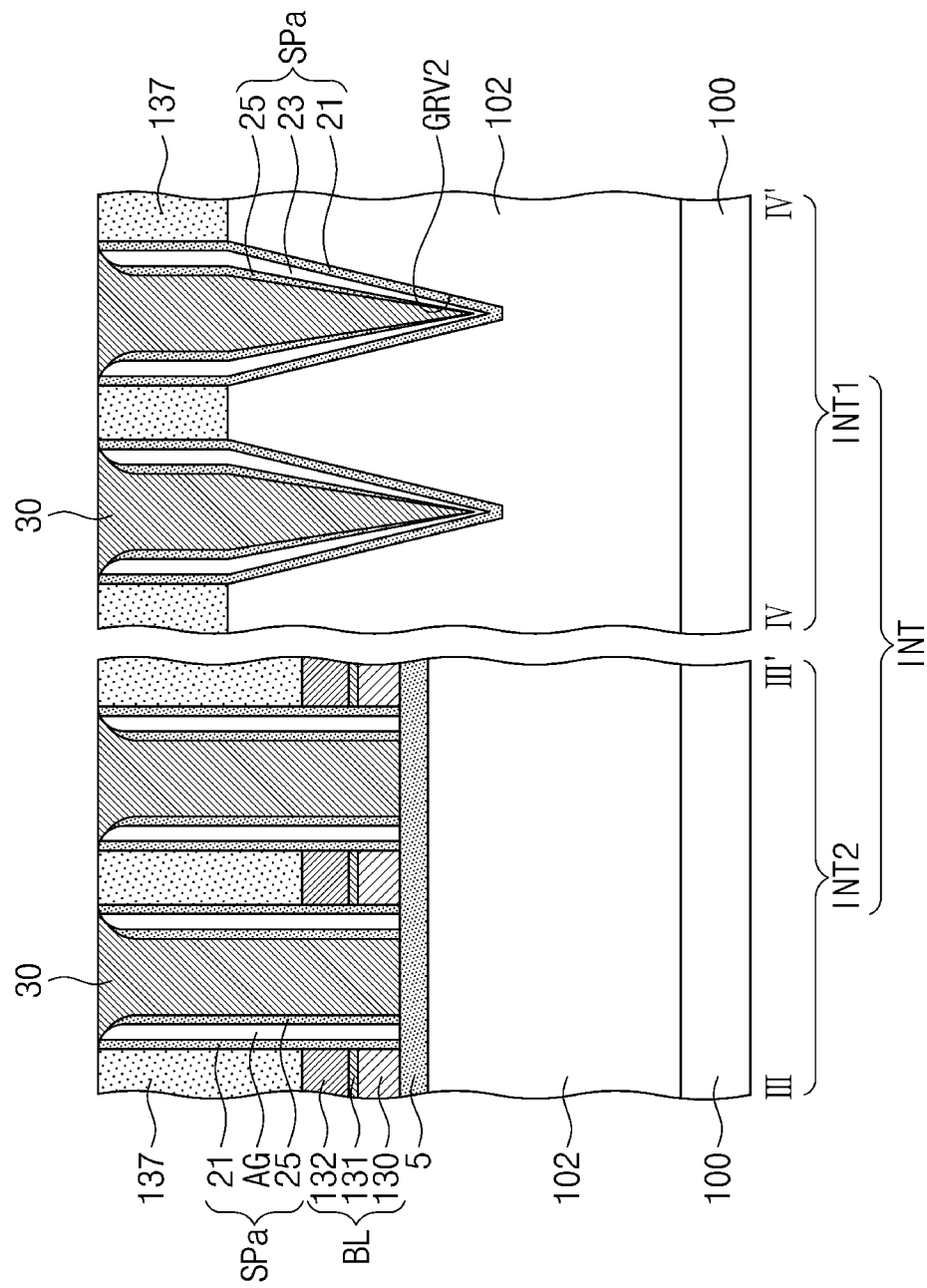

Referring to FIGS. 7A to 7C, a sacrificial layer may be formed on the entire surface of the substrate 100, and then the sacrificial layer may be patterned to form sacrificial semiconductor patterns 30 that define positions of first contacts BC which will be discussed below. In this step, first openings 31 may be formed between the sacrificial semiconductor patterns 30. The sacrificial layer may include a material having etch selectivity with respect to the sacrificial spacer 23. For example, the sacrificial layer may include or may be formed of polycrystalline silicon. For more detail, the sacrificial layer may include impurity-undoped polycrystalline silicon. The sacrificial semiconductor patterns 30 may be formed to be spaced apart from each other between the bit lines BL. The sacrificial semiconductor patterns 30 may vertically overlap the second impurity regions 112*b*. The sacrificial semiconductor patterns 30 may be disposed therebetween with the first openings 31 that define positions of insulation fences 40 which will be discussed below. The first openings 31 may vertically overlap the word lines WL. The first openings 31 may expose top surfaces of the cell buried dielectric pattern 141 and the interlayer dielectric pattern 5. Although a partial etching is performed on upper portions of the first spacer 21, the sacrificial spacer 23, and the second spacer 25 that are exposed to the first openings 31 in the procedure where the sacrificial layer is patterned, it may be possible to avoid damages to the first spacer 21, the sacrificial spacer 23, and the second spacer 25 by controlling etching conditions and considering loading effects or the like.

The sacrificial spacer 23 may be removed in a subsequent process, and thus a region where the sacrificial spacer 23 is present may be changed into an air gap AG to reduce capacitance dispersion of the bit line BL. Thus, when the sacrificial spacer 23 and the sacrificial layer are simultaneously etched and damaged, the air gap AG may not be effectively formed. For example, when the sacrificial spacer 23 is damaged during a time when the sacrificial layer is being patterned to form the sacrificial semiconductor patterns 30, the air gap AG is not effectively formed from the damaged sacrificial spacer 23 in a step of forming the air gap AG, which will be described with reference to FIGS. 10A, 10B, and 10C. According to some example embodiments of the present inventive concepts, the sacrificial layer may include or may be formed of a material, such as impurity-undoped polycrystalline silicon, having etch selectivity with respect to the sacrificial spacer 23. Therefore, compared to a case where the sacrificial layer and the sacrificial spacer 23 include the same material, the sacrificial spacer 23, which will be later replaced with the air gap AG, may be prevented from being damaged in the step where the sacrificial layer is patterned to form the sacrificial semiconductor patterns 30, with the result that a semiconductor memory device may be provided to have improved performance and increased reliability.

Figure 8A:
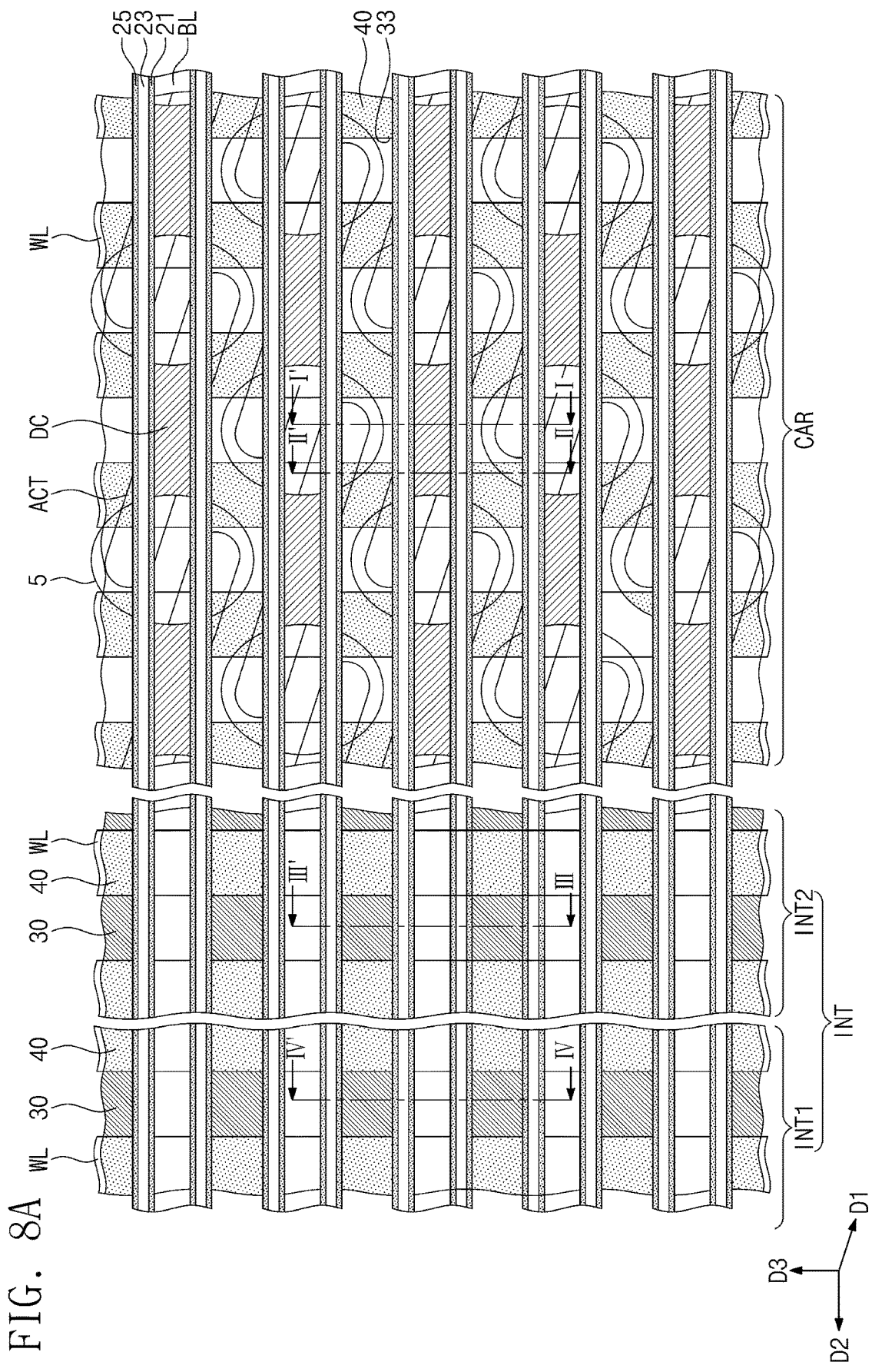
Figure 8B:
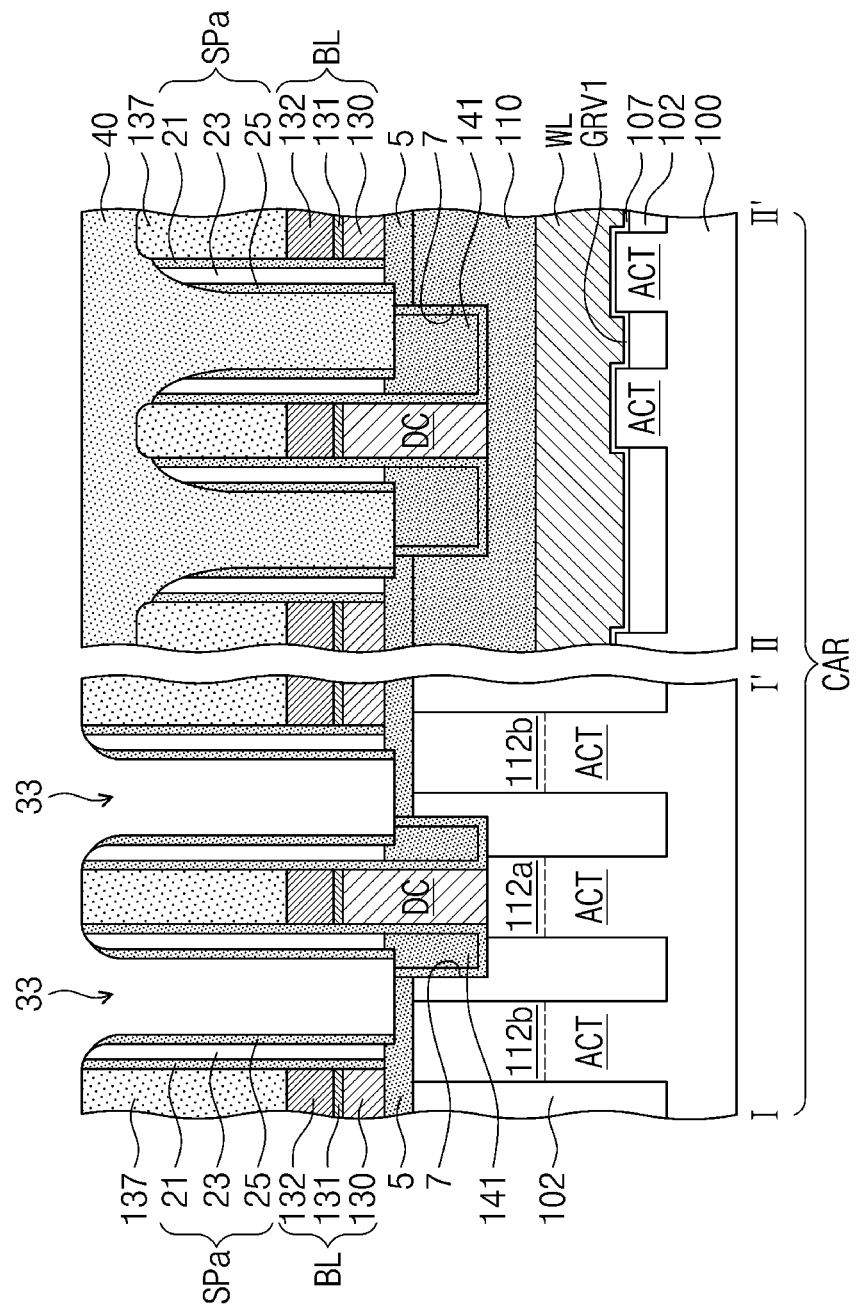
Figure 8C:
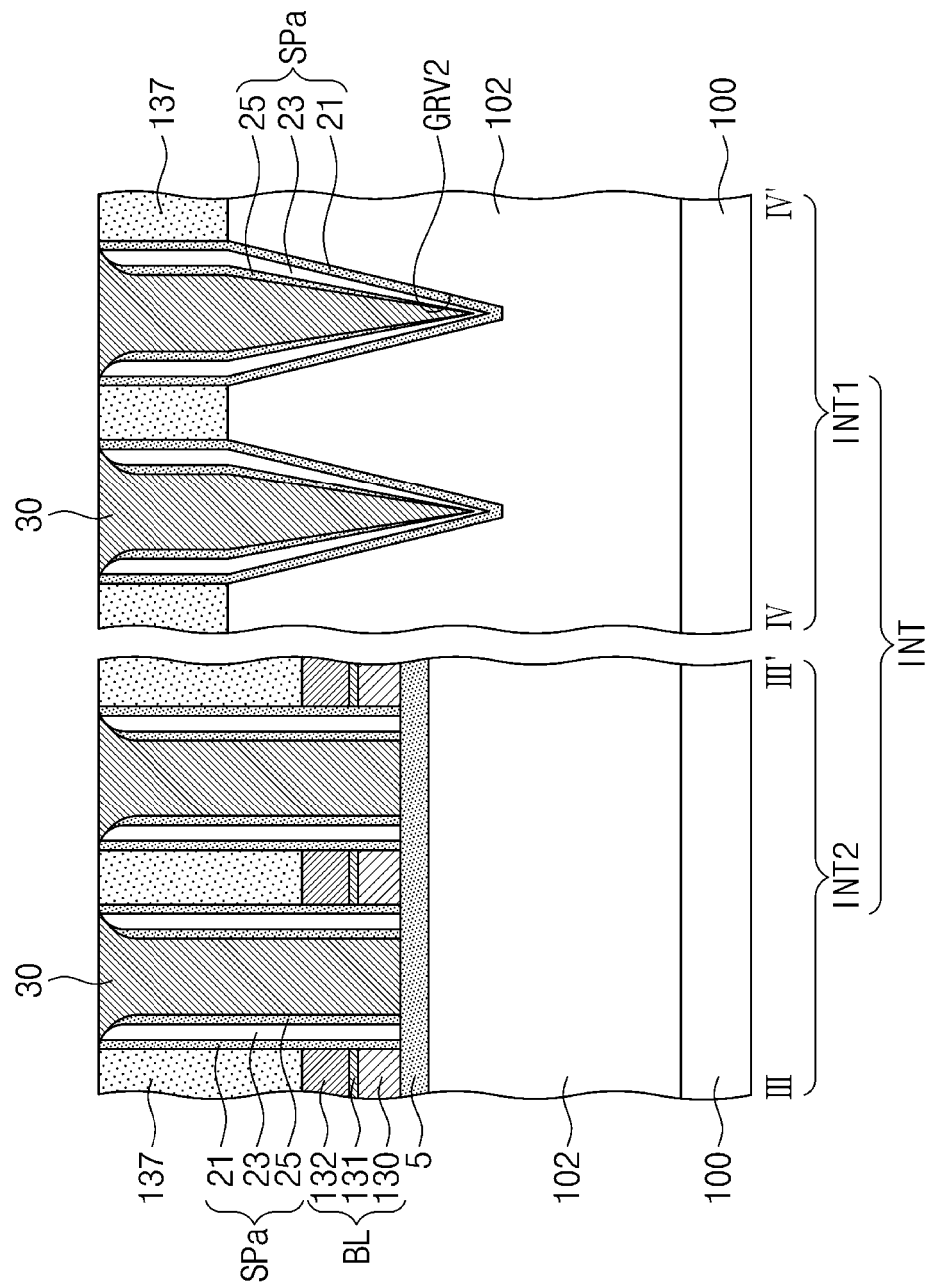

Referring to FIGS. 8A to 8C, a dielectric layer such as a silicon nitride layer may be formed on the entire surface of the substrate 100, filling the first openings 31. The dielectric layer may undergo a planarization etching process to form insulation fences 40 that fill the first openings 31. The cell array region CAR may undergo an etching process to remove the sacrificial semiconductor patterns 30. In this step, an etching protection layer may be formed on the interface region INT such that the sacrificial semiconductor patterns 30 are not removed from the interface region INT. The sacrificial semiconductor patterns 30 on the cell array region CAR may be removed to form second openings 33 that expose the interlayer dielectric pattern 5 overlapping the second impurity regions 112b.

Figure 9A:
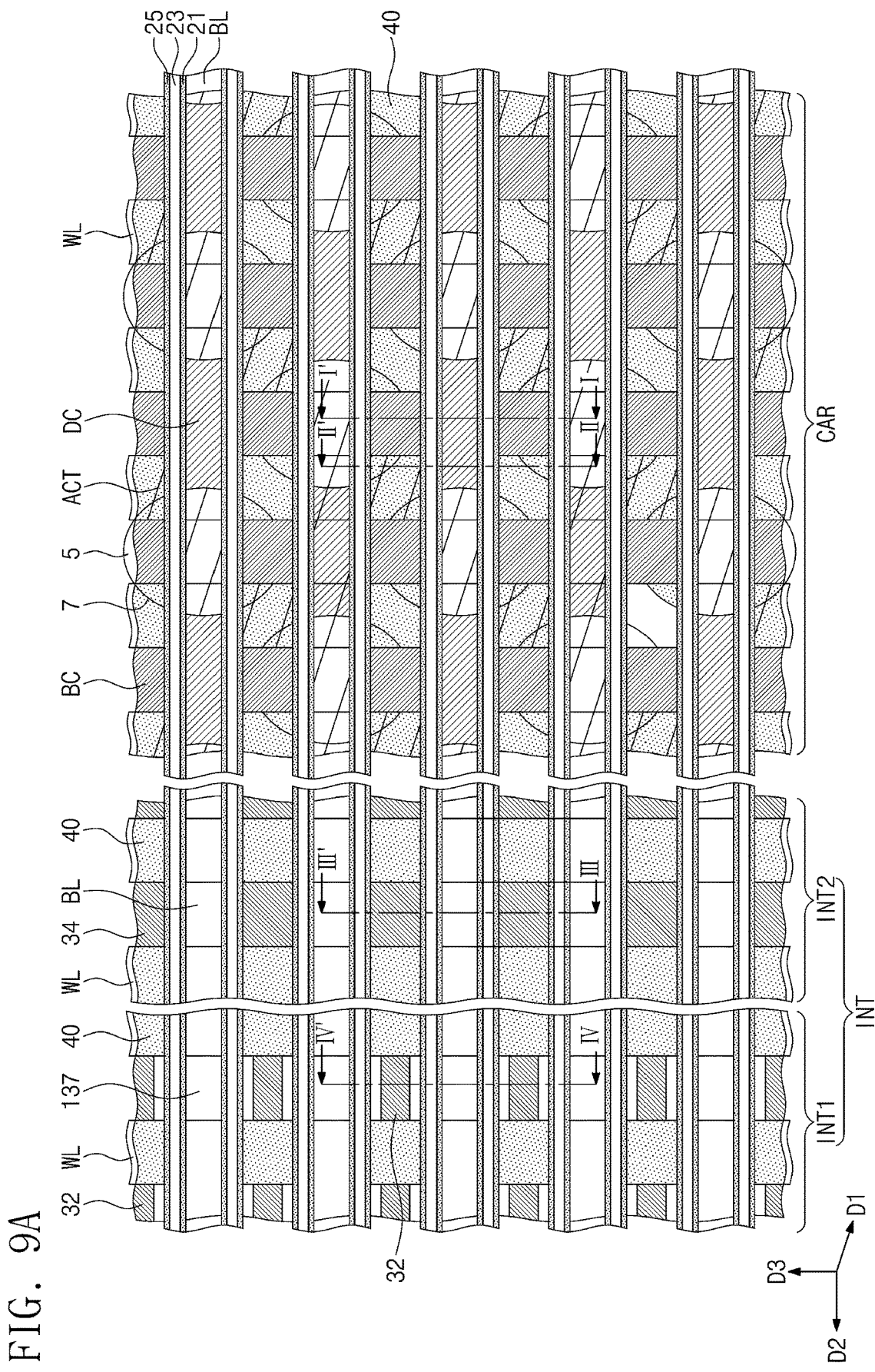
Figure 9B:
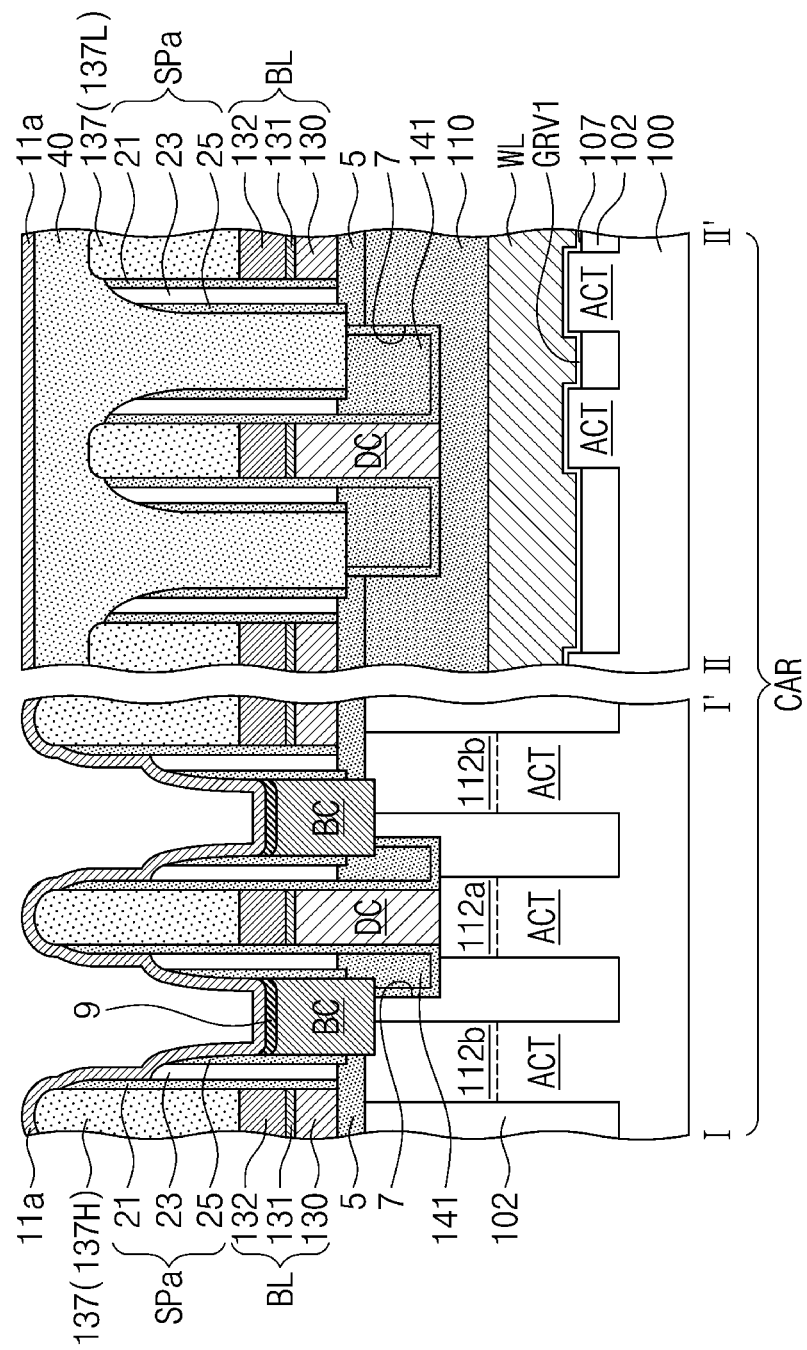
Figure 9C:
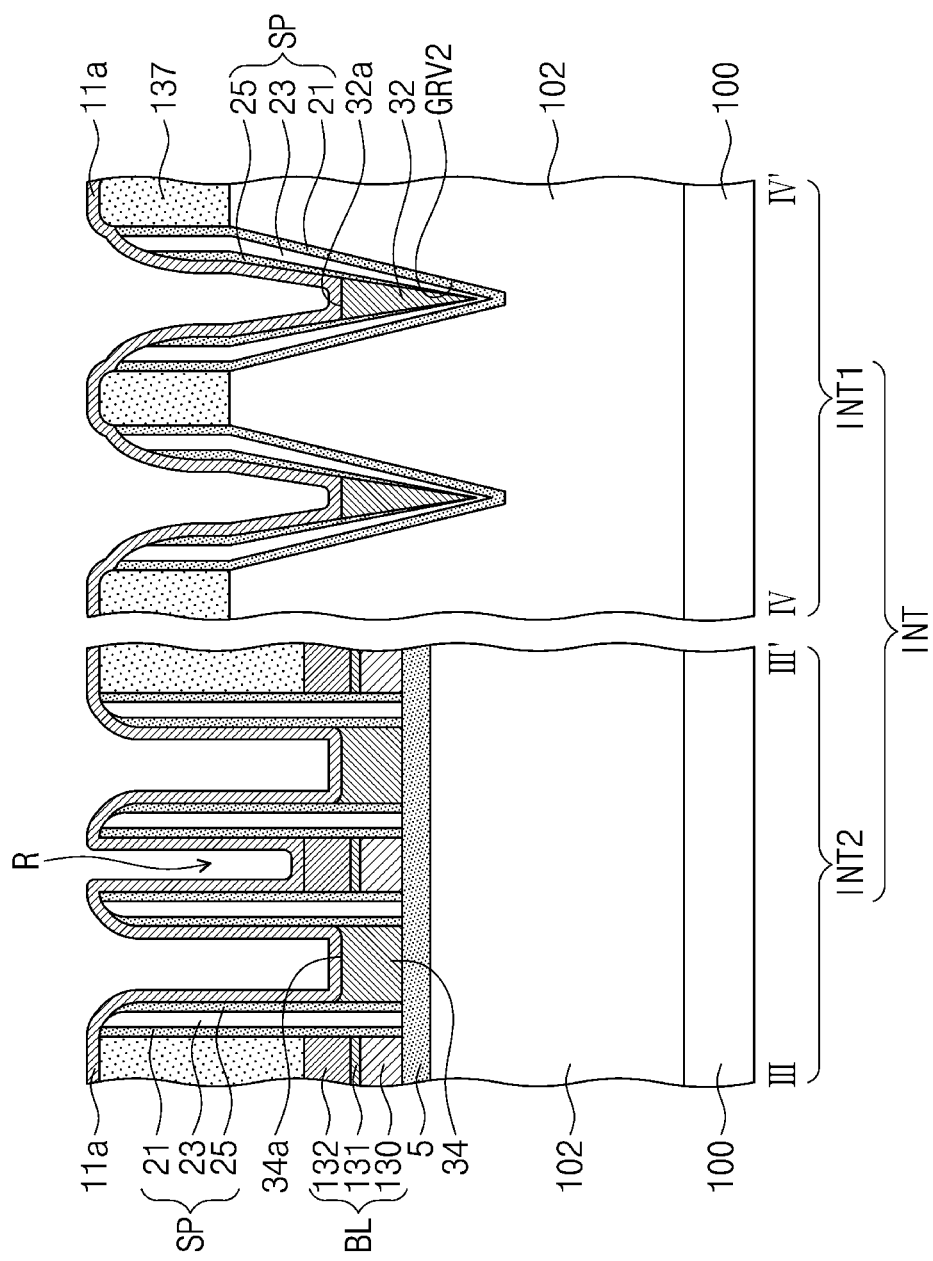

Referring to FIGS. 9A to 9C, on the cell array region CAR, the interlayer dielectric pattern 5 exposed to the second openings 33, the device isolation pattern 102, and the substrate 100 (e.g., the second impurity regions 112b) may be partially removed to expose the second impurity regions 112b. In an embodiment, the second impurity regions 112b may be over-etched. A polycrystalline silicon layer may be formed on the cell array region CAR of the substrate 100 so as to fill the second openings 33, and then the polycrystalline silicon layer may be etched to form first contacts BC. As shown in FIG. 9B, the first contact BC may have a top surface at a height (level) lower than that of top ends of the first spacer 21, the sacrificial spacer 23, and the second spacer 25. Therefore, the first spacer 21, the sacrificial spacer 23, and the second spacer 25 may have their exposed upper portions. During a time when the first contacts BC is being formed, the upper portions of the sacrificial spacer 23 and the second spacer 25 may be removed. The first spacer 21 may thus have an exposed upper sidewall. This process may provide a large process margin for forming landing pads which will be discussed below. When removing the upper portions of the sacrificial spacer 23 and the second spacer 25, the upper portion of the first spacer 21 may be partially removed to reduce a width of the first spacer 21. A cleaning process may be performed to clean the top surface of the first contact BC. The top surface of the first contact BC may undergo a metal silicidation process to form a storage node ohmic layer 9. The storage node ohmic layer 9 may be formed of a metal silicide layer, such as a cobalt silicide layer.

On the interface region INT, upper portions of the sacrificial semiconductor patterns 30 may be etched to form first sacrificial semiconductor patterns 32 and second sacrificial semiconductor patterns 34. For example, the sacrificial semiconductor patterns 30 may be etched in an etching process where the first contact BC is formed on the cell array region CAR. Therefore, the first contact BC may have a top surface at the same level as that of top surfaces of the first and second sacrificial semiconductor patterns 32 and 34. When the sacrificial semiconductor patterns 30 are etched, upper portions of the first, and second spacers 21, and 25, upper portions of the sacrificial spacer 23, and upper portions of the dielectric patterns 137 may also be partially removed. On the second interface region INT2, the dielectric patterns 137 may be partially etched to form recesses R. The recesses R may expose top surfaces of the bit lines BL and an inner wall of the first spacer 21. A diffusion break layer 11a may be conformally formed on the entire surface of the substrate 100. The diffusion break layer 11a may be formed of, for example, a titanium nitride layer or a tantalum nitride layer.

Figure 10A:
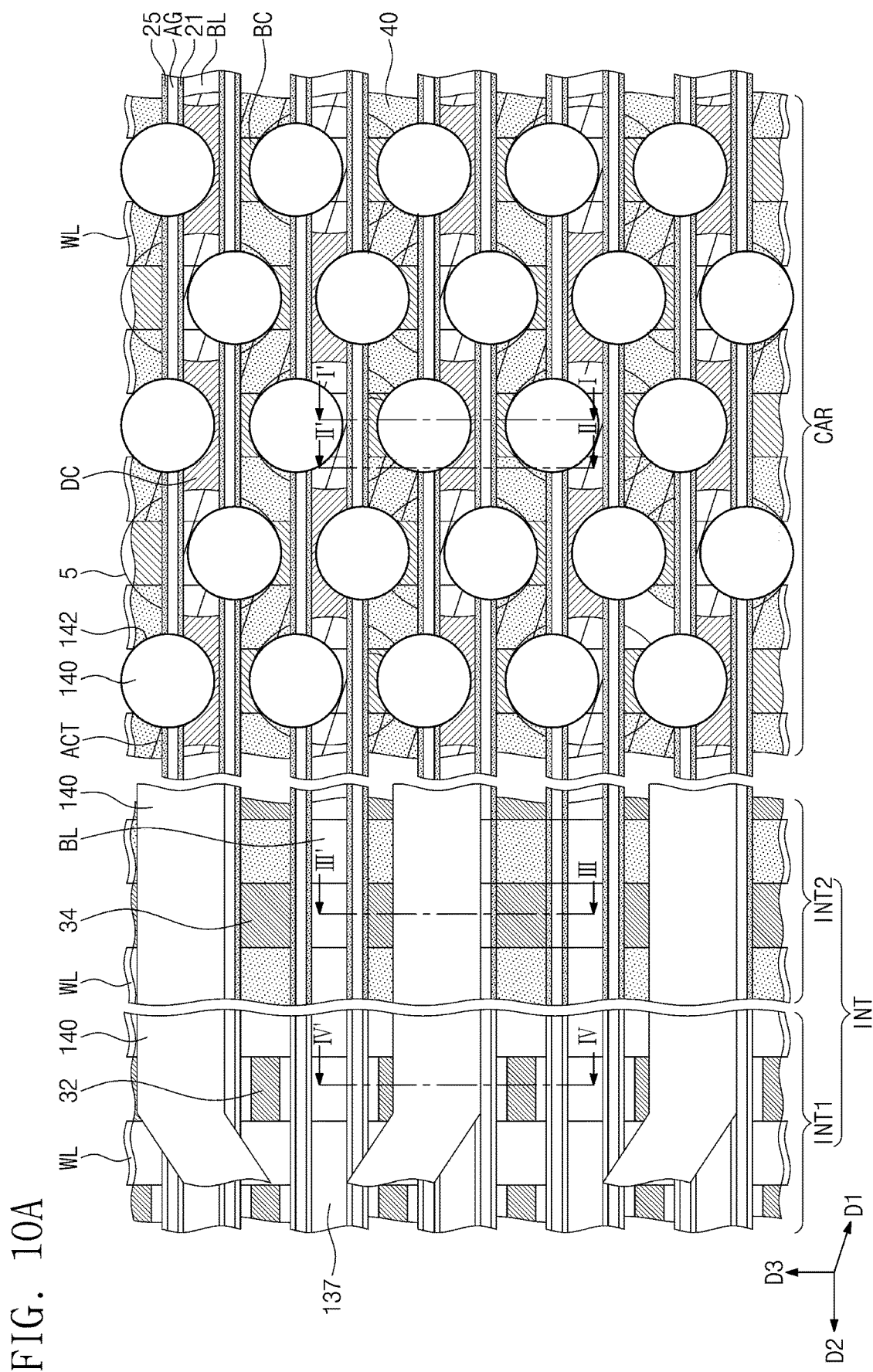
Figure 10B:
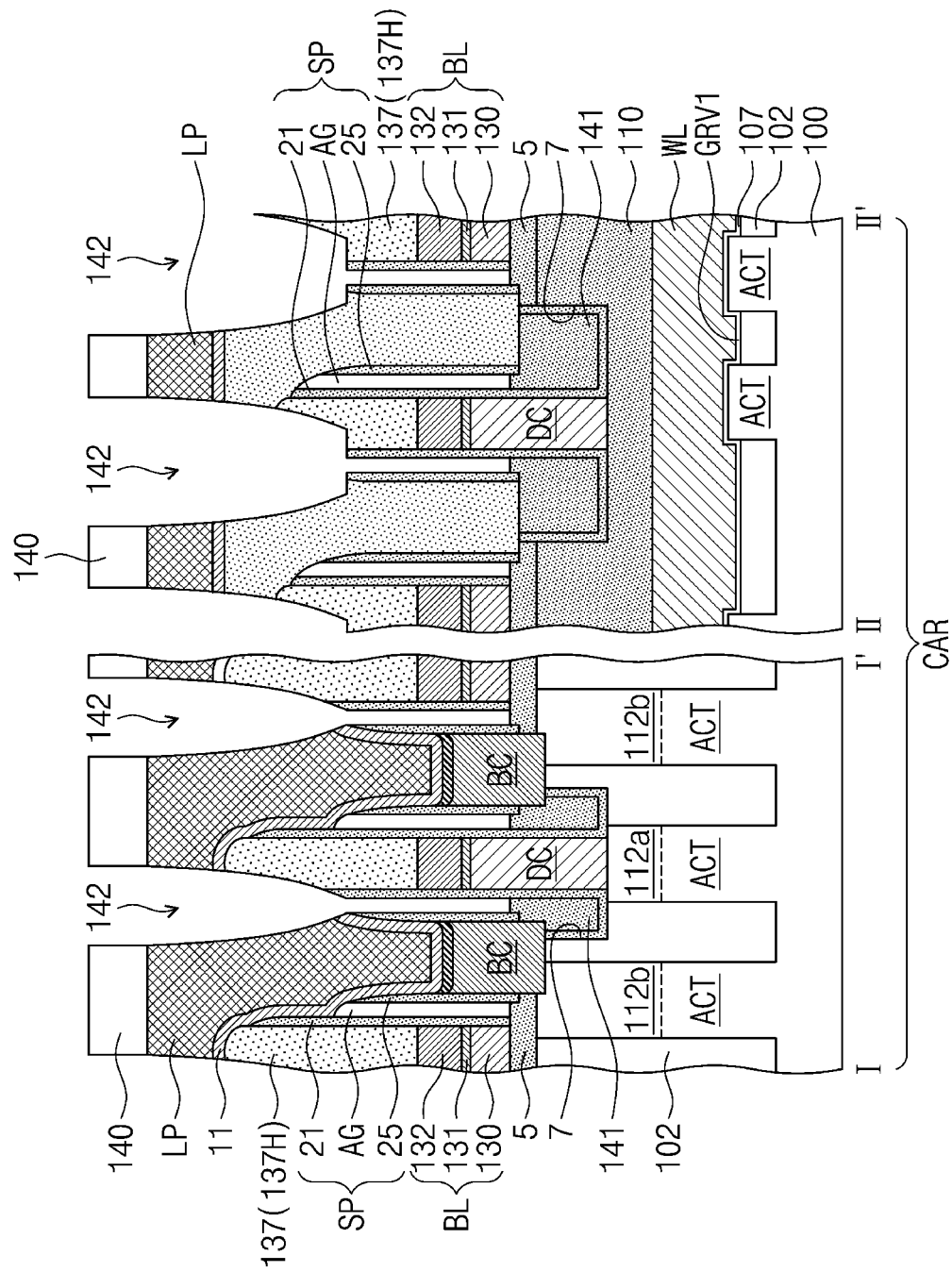
Figure 10C:
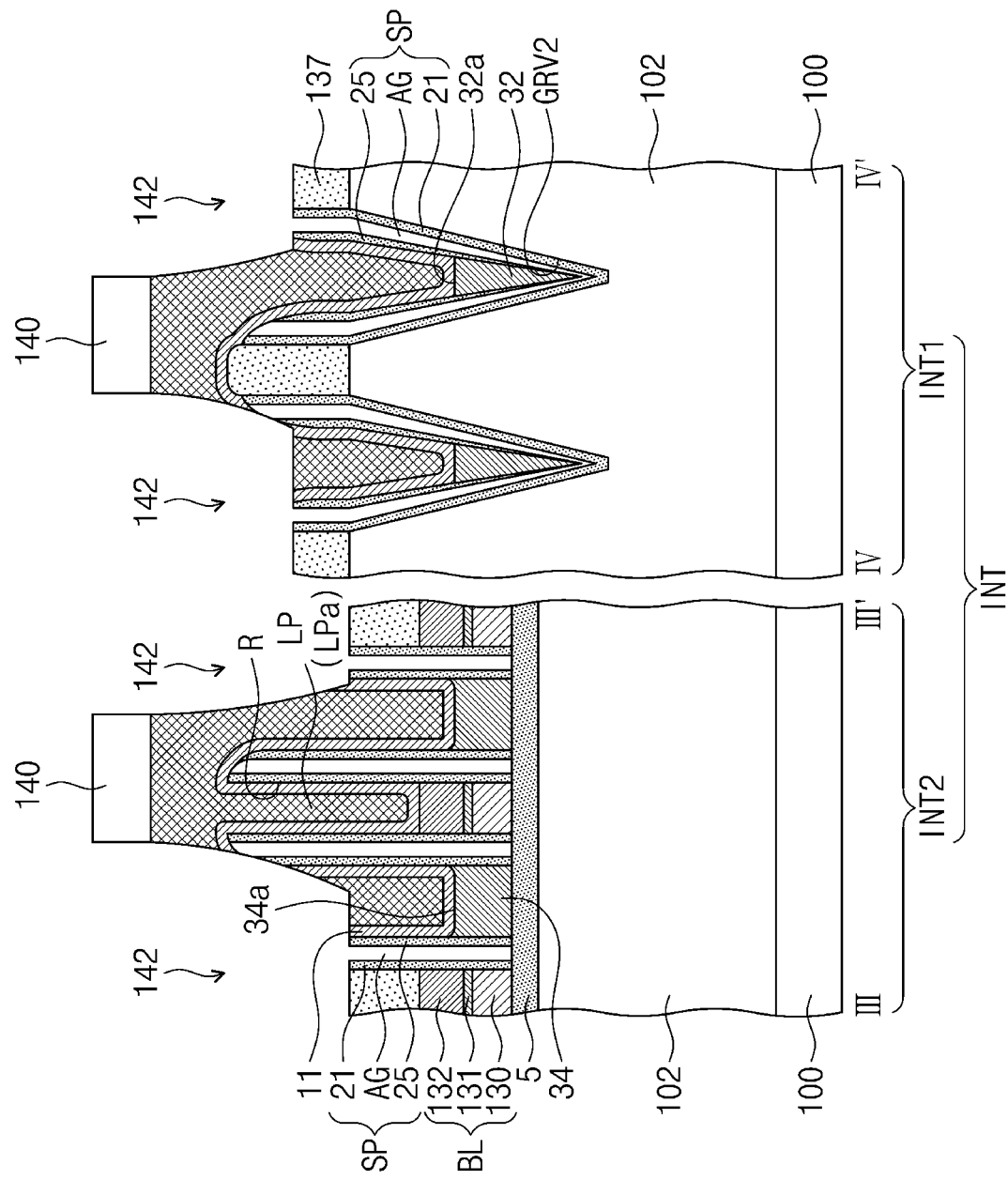

Referring to FIGS. 10A to 10C, a landing pad layer may be formed on the entire surface of the substrate 100, filling spaces between the dielectric patterns 137. The landing pad layer may include tungsten. Second mask patterns 140 may be formed on the landing pad layer. The second mask patterns 140 may be formed of, for example, an amorphous carbon layer (ACL). The second mask patterns 140 may define positions of landing pads which will be discussed below. On the cell array region CAR, the second mask patterns 140 may be formed to vertically overlap the first contacts BC. On the cell array region CAR, the second mask patterns 140 may be formed to have island shapes spaced apart from each other. On the interface region INT, the second mask patterns 140 may be formed to have linear shapes that extend in one direction (e.g., the second direction D2).

An etching process may be performed such that the second mask patterns 140 may be used as an etching mask to partially remove the landing pad layer, the diffusion break layer 11a, and the dielectric patterns 137, thereby forming a landing pad LP and a diffusion break pattern 11 and also simultaneously forming fourth recesses 142. In this step, the first and second spacers 21 and 25 on a side of the dielectric pattern 137 may be removed to expose a top end of the sacrificial spacer 23. When the etching process is performed to form the landing pad LP and the fourth recesses 142, an etchant supply may be controlled to suppress sidewalls of the landing pad LP from being etched, with the result that a width of the landing pad LP may be prevented from being reduced. Accordingly, a process margin for the landing pad LP may increase.

The sacrificial spacer 23 exposed to the fourth recesses 142 may be selectively removed. An etchant that etches the sacrificial spacer 23 may be introduced through the fourth recesses 142, thereby removing the sacrificial spacer 23. The etchant may remove the sacrificial spacer 23 and may downwardly flow along the sacrificial spacer 23, and in turn a region where the sacrificial spacer 23 is present may all be changed into an air gap AG. The air gap AG may be evenly formed on the sidewall of the bit line BL, and as a result, coupling capacitance between adjacent bit lines BL may decrease.

Referring back to FIGS. 1A to 1C, the second mask patterns 140 may be removed, and a separation pattern 144 may be formed between the landing pads LP. The separation pattern 144 may fill the fourth recesses 142. The separation pattern 144 may close an entrance of the air gap AG. The separation pattern 144 may include a dielectric material, which dielectric material may include, for example, silicon oxide or silicon nitride. On the cell array region CAR, data storage elements (e.g., capacitors) may be formed on the landing pads LP. Each of the data storage elements may include a bottom electrode BE, a dielectric layer, and a top electrode. The data storage elements are not formed on the interface region INT. The processes mentioned above may fabricate a semiconductor memory device according to some example embodiments of the present inventive concepts.

For a semiconductor memory device according to the present inventive concept, polycrystalline silicon having etch selectivity with respect to adjacent spacer structures may be used to form insulation fences. Therefore, the adjacent spacer structures may be prevented from being damaged in a step of forming the insulation fences, and accordingly the semiconductor memory device may be provided with increased electrical reliability.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A semiconductor memory device, comprising:
a substrate that has a cell array region, a first interface region, and a second interface region between the cell array region and the first interface region, the cell array region being provided with a plurality of active regions that extend in a first direction;
a plurality of bit lines on the cell array region and the second interface region, the plurality of bit lines extending in a second direction that intersects the first direction;
a plurality of dielectric patterns on top surfaces of the plurality of bit lines, the plurality of dielectric patterns extending in the second direction along the top surfaces of the plurality of bit lines and further extending onto the first interface region;
a device isolation pattern on the substrate,
wherein the device isolation pattern includes a first portion on the cell array region and a second portion on the first interface region,
wherein the first portion of the device isolation pattern defines the plurality of active regions,
wherein the second portion of the device isolation pattern is provided with a plurality of first recesses, and
wherein each of the plurality of first recesses is, when the semiconductor memory device is viewed in a plan view, disposed between two adjacent dielectric patterns among the plurality of dielectric patterns which are disposed on the first interface region; and
a plurality of first sacrificial semiconductor patterns disposed on the first interface region and in the plurality of first recesses of the device isolation pattern,
wherein the plurality of first sacrificial semiconductor patterns include polycrystalline silicon.

2. The semiconductor memory device of claim 1, further comprising:
a plurality of first contacts on the plurality of active regions,
wherein the plurality of first contacts and the plurality of bit lines are alternately and repeatedly disposed in a third direction which is perpendicular to the second direction,
wherein the first direction, the second direction, and the third direction are on the same plane,
wherein the plurality of first contacts include impurity-doped polycrystalline silicon, and
wherein the polycrystalline silicon of the first sacrificial semiconductor patterns is impurity-undoped polycrystalline silicon.

3. The semiconductor memory device of claim 2, further comprising:
a plurality of insulation fences between the first sacrificial semiconductor patterns,
wherein the plurality of first sacrificial semiconductor patterns and the plurality of insulation fences are alternately and repeatedly disposed along the second direction.

4. The semiconductor memory device of claim 1, further comprising:
a plurality of spacer structures on opposite sidewalls of the plurality of bit lines; and
a plurality of second sacrificial semiconductor patterns disposed on the second interface region,
wherein each of the plurality of second sacrificial semiconductor patterns is disposed between two adjacent spacer structures among the plurality of spacer structures, and
wherein the plurality of second sacrificial semiconductor patterns include impurity-undoped polycrystalline silicon.

5. The semiconductor memory device of claim 4, further comprising:
a plurality of word lines extending in a third direction which is perpendicular to the second direction,
wherein the first direction, the second direction, and the third direction are on the same plane, and
wherein the plurality of bit lines and the plurality of second sacrificial semiconductor patterns are alternately and repeatedly disposed in the third direction.

6. The semiconductor memory device of claim 4,
wherein top surfaces of the plurality of first sacrificial semiconductor patterns are located at the same level as top surfaces of the plurality of second sacrificial semiconductor patterns.

7. The semiconductor memory device of claim 1,
wherein first heights of the plurality of first sacrificial semiconductor patterns are in a range of about 200 Å to about 800 Å.

8. The semiconductor memory device of claim 1,
wherein first widths of the plurality of first sacrificial semiconductor patterns decrease as approaching a top surface of the substrate.

9. The semiconductor memory device of claim 8, further comprising:
a plurality of spacer structures on opposite sidewalls of the bit lines; and
a plurality of second sacrificial semiconductor patterns disposed in the second interface region,
wherein each of the plurality of second sacrificial semiconductor patterns is between two adjacent spacer structures among the plurality of spacer structures,
wherein second widths, in a third direction perpendicular to the second direction, of the second sacrificial semiconductor patterns are greater than first widths, in the third direction, of the first sacrificial semiconductor patterns, and
wherein the first direction, the second direction, and the third direction are on the same plane.

10. The semiconductor memory device of claim 1, further comprising:
a plurality of landing pads that cover the plurality of dielectric patterns,
wherein, on the second interface region, the plurality of dielectric patterns include a plurality of recesses that partially expose top surfaces of the plurality of bit lines, and
wherein the plurality of landing pads extend into the plurality of recesses and are disposed on the exposed top surfaces of the plurality of bit lines.

11. The semiconductor memory device of claim 1, further comprising:
a plurality of spacer structures on opposite sidewalls of the dielectric patterns, the spacer structures extending from the cell array region onto the first interface region,
wherein the spacer structure includes a first spacer, a second spacer, and an air gap between the first spacer and the second spacer.

12. The semiconductor memory device of claim 1, further comprising:

a plurality of word lines disposed on the plurality of active regions and extending in a third direction perpendicular to the second direction, wherein the first direction, the second direction, and the third direction are on the same plane, wherein, when the semiconductor memory device is viewed in a plan view, the plurality of dielectric patterns include a plurality of first parts that overlap the plurality of word lines and a plurality of second parts that do not overlap the plurality of word lines, and wherein heights of the plurality of second parts of the plurality of dielectric patterns are greater than heights of the plurality of first parts of the plurality of dielectric patterns.

13. A semiconductor memory device, comprising:

a substrate that has a cell array region, a first interface region, and a second interface region between the cell array region and the first interface region, the cell array region being provided with a plurality of active regions that extend in a first direction;

a plurality of bit lines on the cell array region and the second interface region, the plurality of bit lines extending in a second direction that is different from the first direction;

a plurality of word lines on the substrate, the word lines extending in a third direction perpendicular to the second direction, wherein the first direction, the second direction, and the third direction are on the same plane;

a plurality of insulation fences on the plurality of word lines and spaced apart in the third direction from each other, wherein the plurality of insulation fences and the plurality of bit lines are alternately and repeatedly disposed in the third direction; and a plurality of first sacrificial semiconductor patterns disposed on the first interface region, wherein the plurality of first sacrificial semiconductor patterns and the plurality of insulation fences are alternately and repeatedly disposed in the second direction, and wherein the plurality of first sacrificial semiconductor patterns include polycrystalline silicon.

14. The semiconductor memory device of claim 13, further comprising:

a plurality of spacer structures on opposite sidewalls of the plurality of bit lines on the cell array region, the plurality of spacer structures extending onto the first interface region and the second interface region; and a device isolation pattern on the substrate, wherein the device isolation pattern includes a first portion on the cell array region and a second portion on the first interface region, wherein the first portion of the device isolation pattern defines the plurality of active regions, wherein the second portion of the device isolation pattern is provided with a plurality of recesses, and wherein the plurality of first sacrificial semiconductor patterns fill the plurality of recesses so that each of the plurality of first sacrificial semiconductor patterns is disposed between two adjacent spacer structures, disposed in the third direction, among the plurality of spacer structures.

15. The semiconductor memory device of claim 13, further comprising:

a plurality of dielectric patterns on top surfaces of the plurality of bit lines, the plurality of dielectric patterns extending along the top surfaces of the plurality of bit lines and further extending onto the first interface region, wherein, when the semiconductor memory device is viewed in a plan view, the plurality of first sacrificial semiconductor patterns and the plurality of dielectric patterns are alternately and repeatedly disposed in the third direction.

16. The semiconductor memory device of claim 13, further comprising:

a plurality of first contacts on the plurality of active regions, wherein the plurality of first contacts and the plurality of the bit lines are alternately and repeatedly disposed in the third direction, wherein the plurality of first contacts include impurity-doped polycrystalline silicon, and wherein the polycrystalline silicon of the first sacrificial semiconductor patterns is impurity-undoped polycrystalline silicon.

17. The semiconductor memory device of claim 13, further comprising:

a plurality of spacer structures on opposite sidewalls of the plurality of bit lines; and a plurality of second sacrificial semiconductor patterns disposed on the second interface region, wherein each of the plurality of second sacrificial semiconductor patterns is disposed between two adjacent spacer structures among the plurality of spacer structures, and wherein second widths, in the third direction, of the second sacrificial semiconductor patterns are greater than first widths, in the third direction, of the first sacrificial semiconductor patterns.

18. The semiconductor memory device of claim 17, wherein opposite sidewalls of each of the plurality of second sacrificial semiconductor patterns are in contact with inner sidewalls of two adjacent spacer structures among the plurality of spacer structures.

19. A semiconductor memory device, comprising:

a substrate that has a cell array region, a first interface region, and a second interface region between the cell array region and the first interface region, the cell array region being provided with a plurality of active regions that extend in a first direction;

a plurality of bit lines on the cell array region and the second interface region, the plurality of bit lines extending in a second direction that intersects the first direction;

a plurality of word lines disposed on the plurality of active regions, the plurality of word lines extending in a third direction perpendicular to the second direction, wherein the first direction, the second direction, and the third direction are on the same plane;

a plurality of dielectric patterns on top surfaces of the plurality of bit lines, the plurality of dielectric patterns extending along the top surfaces of the plurality of bit lines and further extending onto the first interface region;

a plurality of spacer structures on opposite sidewalls of the plurality of dielectric patterns, each of the plurality of spacer structures including a first spacer, a second spacer, and an air gap between the first spacer and the second spacer;

a device isolation pattern on the substrate, wherein the device isolation pattern includes a first portion on the cell array region and a second portion on the first interface region,
wherein the first portion of the device isolation pattern defines the plurality of active regions, and
wherein the second portion of the device isolation pattern is provided with a plurality of recesses;
a plurality of first sacrificial semiconductor patterns in the plurality of recesses of the device isolation pattern on the first interface region, the plurality of first sacrificial semiconductor patterns including polycrystalline silicon;
a diffusion break pattern that covers the plurality of dielectric patterns and the plurality of spacer structures;
a plurality of landing pads on the diffusion break pattern; and
a plurality of bottom electrodes on plurality of landing pads.

20. The semiconductor memory device of claim 19, further comprising:
a plurality of first contacts on the active regions,
wherein the plurality of first contacts and the plurality of bit lines are alternately and repeatedly disposed in the third direction; and
a plurality of insulation fences on the plurality of word lines,
wherein the plurality of insulation fences and the plurality of first contacts are alternately and repeatedly disposed in the second direction.

* * * * *